United States Patent
Naito

(10) Patent No.: US 8,008,127 B2
(45) Date of Patent: Aug. 30, 2011

(54) METHOD OF FABRICATING AN INTEGRATED CIRCUIT HAVING A MULTI-LAYER STRUCTURE WITH A SEAL RING

(75) Inventor: Hiroshi Naito, Kokubu (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 12/253,881

(22) Filed: Oct. 17, 2008

(65) Prior Publication Data

US 2009/0042355 A1 Feb. 12, 2009

Related U.S. Application Data

(60) Division of application No. 11/088,969, filed on Mar. 24, 2005, now Pat. No. 7,554,176, which is a continuation-in-part of application No. 11/039,956, filed on Jan. 24, 2005, now Pat. No. 7,193,296.

(30) Foreign Application Priority Data

| Mar. 29, 2004 | (JP) | 2004-094621 |
| Mar. 29, 2004 | (JP) | 2004-094622 |
| Mar. 16, 2005 | (JP) | 2005-075554 |

(51) Int. Cl.
*H01L 21/00* (2006.01)
*H01L 23/12* (2006.01)

(52) U.S. Cl. ........ 438/110; 438/623; 438/629; 257/620; 257/700; 257/758

(58) Field of Classification Search .................. None
See application file for complete search history.

(56) References Cited

U.S. PATENT DOCUMENTS

| 1,554,176 | A | * | 9/1925 | Becker | 235/70 R |
| 4,409,319 | A | * | 10/1983 | Colacino et al. | 430/296 |
| 5,593,925 | A |   | 1/1997 | Yamaha et al. | |
| 5,616,960 | A |   | 4/1997 | Noda et al. | |
| 5,831,330 | A |   | 11/1998 | Chang et al. | |
| 5,851,923 | A |   | 12/1998 | Rolfson | |
| 5,936,308 | A |   | 8/1999 | Rolfson | |
| 6,107,196 | A |   | 8/2000 | Rolfson | |
| 6,242,339 | B1 | * | 6/2001 | Aoi | 438/623 |
| 6,300,223 | B1 |   | 10/2001 | Chang et al. | |
| 6,521,975 | B1 |   | 2/2003 | West et al. | |
| 6,577,011 | B1 | * | 6/2003 | Buchwalter et al. | 257/758 |

(Continued)

FOREIGN PATENT DOCUMENTS

JP 57-113241 7/1982

(Continued)

*Primary Examiner* — Alonzo Chambliss
(74) *Attorney, Agent, or Firm* — Dickstein Shapiro LLP

(57) ABSTRACT

A plurality of IC regions are formed on a semiconductor wafer, which is cut into individual chips incorporating ICs, wherein wiring layers and insulating layers are sequentially formed on a silicon substrate. In order to reduce height differences between ICs and scribing lines, a planar insulating layer is formed to cover the overall surface with respect to ICs, seal rings, and scribing lines. In order to avoid occurrence of breaks and failures in ICs, openings are formed to partially etch insulating layers in a step-like manner so that walls thereof are each slanted by prescribed angles ranging from 20° to 80°. For example, a first opening is formed with respect to a thin-film element section, and a second opening is formed with respect to an external-terminal connection pad.

15 Claims, 10 Drawing Sheets

U.S. PATENT DOCUMENTS

| | | | |
|---|---|---|---|
| 6,870,265 B2 | 3/2005 | Kurimoto et al. | |
| 6,879,023 B1 | 4/2005 | Gutierrez | |
| 6,940,160 B1 | 9/2005 | Hanaoka et al. | |
| 6,951,801 B2 | 10/2005 | Pozder et al. | |
| 7,129,566 B2 | 10/2006 | Uehling et al. | |
| 7,193,296 B2 | 3/2007 | Fujita | |
| 7,211,897 B2 * | 5/2007 | Yamanoue et al. | 257/758 |
| 7,728,423 B2 * | 6/2010 | Naito | 257/700 |
| 2003/0215975 A1 * | 11/2003 | Martin et al. | 438/57 |
| 2004/0084777 A1 | 5/2004 | Yamanoue et al. | |
| 2006/0082003 A1 | 4/2006 | Shizuno | |
| 2007/0170591 A1 * | 7/2007 | Yamanoue et al. | 257/758 |

FOREIGN PATENT DOCUMENTS

| | | |
|---|---|---|
| JP | 59-014663 | 1/1984 |
| JP | 62-264642 | 11/1987 |
| JP | S63-70598 | 3/1988 |
| JP | 64-002335 | 1/1989 |
| JP | 03-066123 A | 3/1991 |
| JP | 04-354122 | 12/1992 |
| JP | 05-121793 | 5/1993 |
| JP | 06-310597 | 11/1994 |
| JP | 07-037839 | 2/1995 |
| JP | 07-094580 | 4/1995 |
| JP | 10-270386 | 10/1998 |
| JP | 2003-100744 | 4/2003 |
| JP | 2003-224138 | 8/2003 |
| JP | 2003-249576 A | 9/2003 |
| JP | 2004-095877 | 3/2004 |
| WO | WO/00-55898 | 9/2000 |
| WO | WO-2004051298 | 6/2004 |

* cited by examiner

FIG. 4
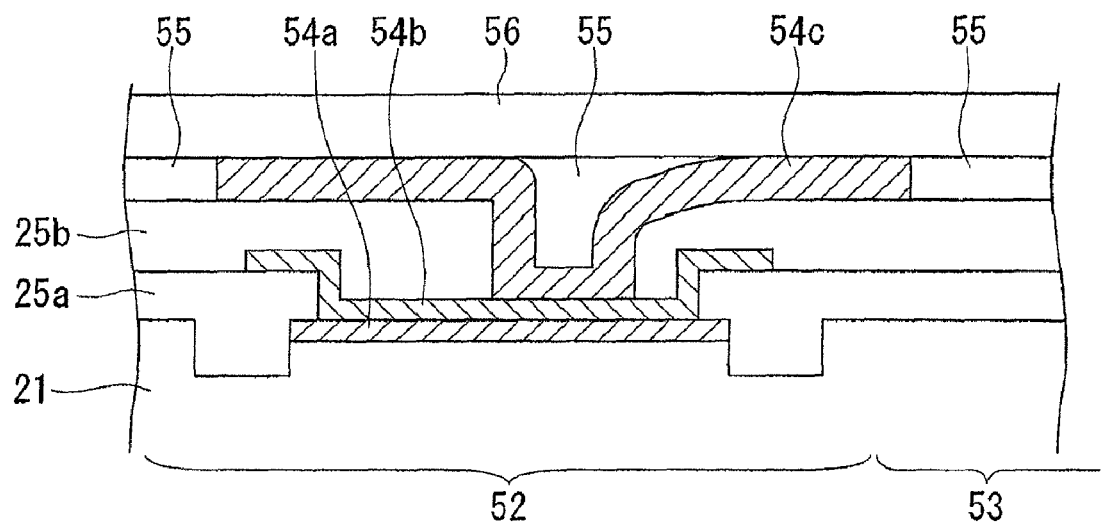
PRIOR ART   FIG. 5
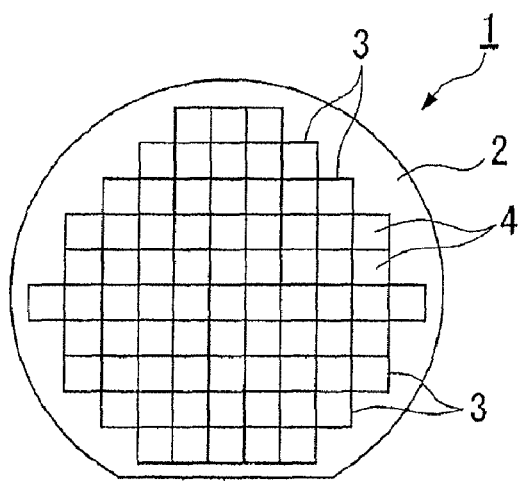

PRIOR ART FIG. 6
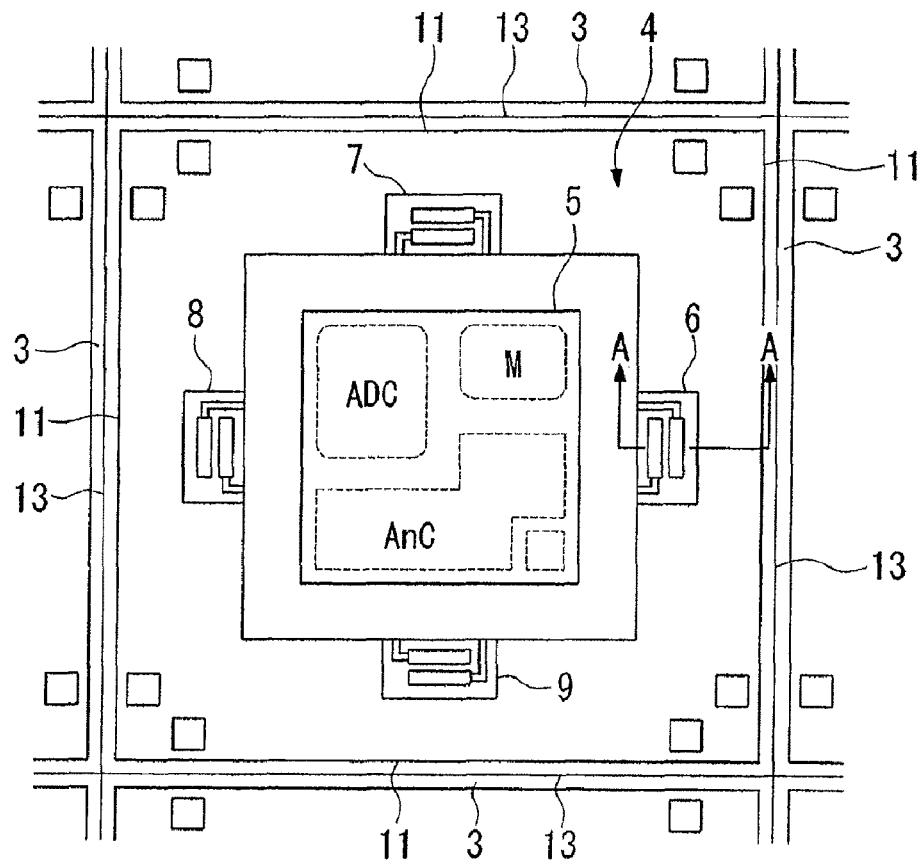
PRIOR ART FIG. 7
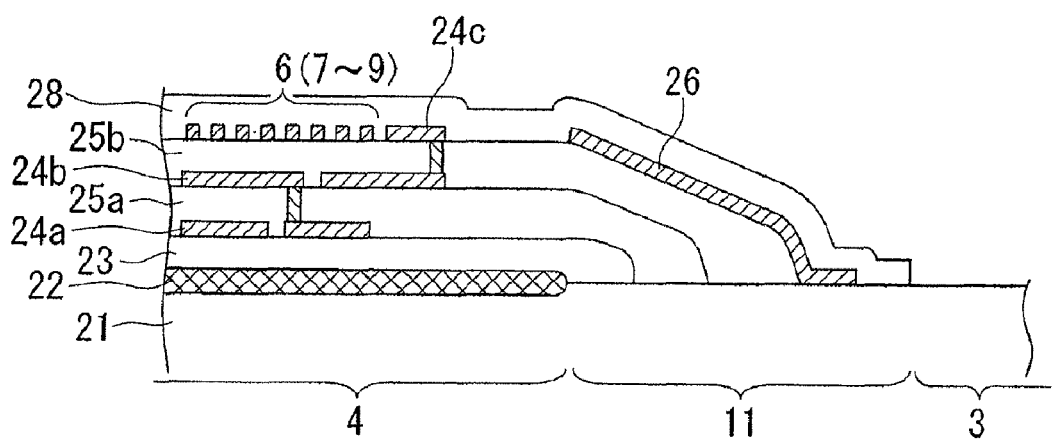

PRIOR ART FIG. 8
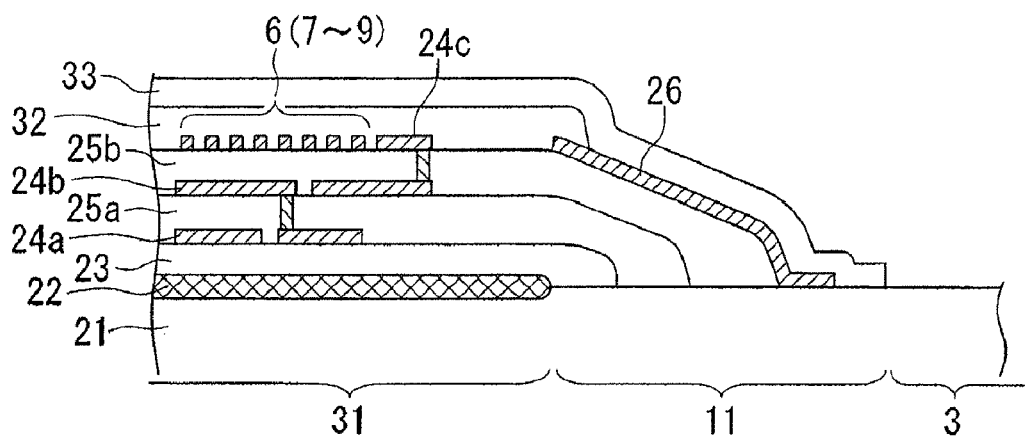
PRIOR ART FIG. 9
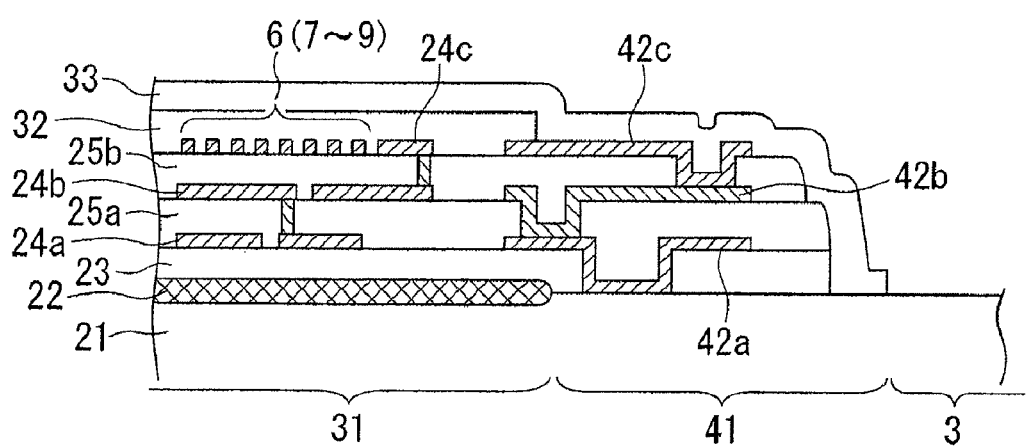

US 8,008,127 B2

METHOD OF FABRICATING AN INTEGRATED CIRCUIT HAVING A MULTI-LAYER STRUCTURE WITH A SEAL RING

CROSS-REFERENCE TO RELATED APPLICATIONS

This application is a divisional U.S. patent application Ser. No. 11/088,969, filed Mar. 24, 2005, which is a continuation-in-part of U.S. patent application Ser. No. 11/039,956, filed Jan. 24, 2005, now U.S. Pat. No. 7,193,296 the entirety of which are incorporated herein by reference.

BACKGROUND OF THE INVENTION

1. Field of the Invention

This invention relates to semiconductor wafers and to manufacturing methods therefor, in which integrated circuits are formed on semiconductor wafers, which are cut into individual chips along scribing lines. This invention also relates to semiconductor devices having thin-film elements, which are formed on semiconductor wafers, and to manufacturing methods therefor.

This application claims priority on Japanese Patent Applications Nos. 2004-94621, 2004-94622 and 2005-75554, the contents of which are incorporated herein by reference.

2. Description of the Related Art

Conventionally, semiconductor devices such as IC chips and LSI chips are manufactured using semiconductor wafers such as silicon wafers. In accordance with processes regarding thin film growth, photolithography, and etching, a plurality of integrated circuits (ICs) are formed on the same semiconductor wafer, which is subjected to cutting along scribing lines by use of dicing saws and the like so as to separate individual IC chips (or semiconductor chips), wherein semiconductor chip are each subjected to wire bonding with lead frames and are then subjected to resin molding.

Recently, a variety of electronic devices are manufactured and developed to realize highly-sophisticated functions, wherein they are reduced in sizes and dimensions realizing small thickness, whereby it is possible to produce composite semiconductor devices having multiple functions realizing functions of magnetic sensors, temperature sensors, and pressure sensors, which are put to practical uses. For example, composite semiconductor devices are accompanied with magnetic sensors, an example of which is disclosed in Japanese Patent Application Publication No. H05-121793, wherein IC chips are equipped with giant magnetoresistive effect elements (referred to as GMR elements).

FIG. 5 is a plan view showing a silicon wafer (or a semiconductor wafer) on which a plurality of semiconductor devices (i.e., semiconductor chips having magnetic sensors) are formed; FIG. 6 is an enlarged plan view showing a semiconductor device (i.e., a semiconductor chip having a magnetic sensor) and its periphery; and FIG. 7 is a cross-sectional view taken along line A-A in FIG. 6.

In FIG. 5, reference numeral 1 designates a silicon wafer in which scribing lines 3 are formed in a latticed manner on a silicon substrate (or a semiconductor substrate) so as to form a plurality of IC regions in a matrix manner, wherein the IC regions include IC components 4.

The IC components 4 each have a laminated structure in which wiring layers including electric circuits and insulating layers are alternately laminated together. Specifically, as shown in FIG. 6, the IC component 4 having a square shape includes an IC 5 implementing functions of various circuits such as an analog-to-digital converter (ADC), a memory (M), and an analog circuit (AnC), wherein GMR elements 6 to 9 are respectively arranged externally of and in proximity to prescribed sides (e.g., four sides in case of FIG. 6) of the IC 5 and are electrically connected with the IC 5. That is, a magnetic sensor is realized by the GMR elements 6 to 9.

Seal rings 11 are formed to encompass the IC component 4. Scribing lines 3, which are band-like regions having prescribed widths, are formed outside of the seal rings 11 in boundaries between adjacent IC regions. Channels 13 for separation of individual semiconductor chips are formed at the center of scribing lines 3.

FIG. 7 shows a cross-sectional structure with regard to the IC component 4, seal ring 11, and scribing line 3, wherein an integrated circuit (IC) implementing functions of an analog-to-digital converter (ADC), a memory (M), and an analog circuit (AnC) and an insulating layer 22 composed of silicon oxide are formed on a p-type silicon substrate (referred to as a p-Si substrate) 21; an insulating layer 23 is formed to cover the IC region and the insulating layer 22 such the one end thereof extends to the seal ring 11; a wiring layer 24a having a prescribed wiring pattern, an insulating layer 25a, a wiring layer 24b having a prescribed wiring pattern, and an insulating layer 25b are sequentially formed and laminated together on the insulating layer 23. The three insulating layers 23, 25a, and 25b are arranged at vertically different positions, wherein the insulating layers 25a and 25b are each slanted and extend in the seal ring 11 in such a way that the insulating layer 25a covers the insulating layer 23, and the insulating layer 25b covers the insulating layer 25a.

The GMR elements 6 to 9 and a wiring layer 24c are formed on a planar surface of the insulating layer 25b, and a metal layer 26, which is formed in the same level of the wiring layer 24c, is formed in a slanted surface of the insulating layer 25b, which extends in the seal ring 11, in such a way that the lower end thereof is brought into contact with the p-type silicon substrate 21. In addition, a passivation film (or a protective insulating layer) 28 composed of silicon nitride is formed to cover the GMR elements 6-9, wiring layer 24c, and metal layer 26. The wiring layers 24a to 24c are electrically connected with each other by metals filled into via holes.

The passivation film 28 is subjected to patterning such that the lower end thereof is limited within the range of the seal ring 11, so that the exposed region of the p-type silicon substrate 21, which is not covered with the passivation film 28, is used for the scribing line 3.

FIG. 8 is a cross-sectional view showing a second example of a silicon wafer, wherein an IC component 31 is constituted such that a planar insulating layer 32 is formed to cover the GMR elements 6-9 and the wiring layer 24c as well as the upper end of the metal layer 26, and a passivation film 33 is formed to cover the planar insulating layer 32 and the metal layer 26.

FIG. 9 is a cross-sectional view showing a third example of a silicon wafer, wherein a seal ring 41 is subjected to patterning to realize a laminated structure comprising the insulating layer 23, a metal layer 42a that is formed in the same level of the wiring layer 24a, the insulating layer 25a, a metal layer 42b that is formed in the same level of the wiring layer 24b, the insulating layer 25b, and a metal layer 42c that is formed in the same level of the wiring layer 24c. The metal layers 42a, 42b, and 42c are electrically connected with each other by metals filled in via holes. In addition, a planar insulating layer 32 is formed to cover the GMR elements 6-9 and the wiring layer 24c as well as one end of the metal layer 42c; a passivation film 33 is formed to cover the planar insulating layer 32 and the upper portion of the metal layer 42c as well as the end portions of the insulating layers 23, 25a, and 25b, whereby the lower end of the passivation film 33 is limited within the range of the seal ring 41.

As described above, the semiconductor chip having the magnetic sensor is constituted in such a way that the magnetoresistive elements are incorporated into the IC; hence, it can cope with the recent tendencies of electronic devices that are reduced in sizes and dimensions realizing small thickness.

Chip regions corresponding to semiconductor chips having thin-film elements have multilayer structures in which wiring layers including electric circuits and insulating layers are laminated together with respect to the IC components 4 and 31 respectively. Thin-film elements such as magnetic sensors are generally formed using thin films in order to avoid deterioration of properties thereof, wherein passivation layers are formed on multilayer structures to realize planarity.

In the scribing line 3 partitioning chip regions, the surface of the p-type silicon substrate 21 is exposed so as to cause a relatively great height difference; hence, nonuniformity of resist application (i.e., striation) may occur in resist formation regions, which are used to form thin-film elements on the IC components 4 and 31. This causes unwanted deviations of shapes and dimensions of thin-film elements. In addition, there is a possibility that contaminating substances produced by thin-film elements may have adverse effects on the 'exposed' silicon-related portions of IC regions.

As disclosed in the aforementioned publication, semiconductor devices such as IC devices and LSI devices have been developed in such a way that thin-film elements such as magnetoresistive elements are formed on ICs via insulating layers, wherein uppermost wiring layers are connected with thin-film elements via openings formed therein.

FIG. 17 is a cross-sectional view showing an example of a semiconductor device accompanied with a thin-film element. That is, a semiconductor device 101 of FIG. 17 is manufactured in such a way that an insulating layer 102 composed of silicon oxide or silicon nitride is formed on the upper portion of an IC formed on a silicon substrate (not shown); and a wiring layer 103 having a prescribed pattern is formed on the insulating layer 102 and is electrically connected with the IC via a via hole (not shown) that is formed in the insulating layer 102.

An insulating layer 104 composed of silicon oxide is formed on the wiring layer 103; and an opening 105 is formed in the insulating layer 104 so as to expose the surface of the wiring layer 103. In addition, a thin-film element 107 is formed in association with the opening 105 of the insulating layer 104 via a wiring layer 106 therefor. Furthermore, an insulating film 108 composed of silicon nitride is formed to encompass peripheral ends of the thin-film element 107.

The insulating film 108 can be formed to entirely cover the upper portion of the thin-film element 107.

Next, a method for forming the opening 105 will be described. As shown in FIG. 18A, vacuum evaporation or sputtering is performed to form the wiring layer 103 having the prescribed pattern on the insulating layer 102; then, the CVD (i.e., Chemical Vapor Deposition) process is performed to form the insulating layer 104, which entirely covers the insulating layer 102 and the wiring layer 103. The spin-coating process is performed to apply a photoresist 109 onto the insulating layer 104. The photoresist 109 is exposed to ultraviolet radiation via a mask (not shown) and is then subjected to development; thus, it is possible to form an opening 109a whose pattern matches the pattern of the mask on the photoresist 109.

Then, plasma etching or reactive ion etching is performed on the insulating layer 104 by using the photoresist 109 as a mask so that the upper surface of the wiring layer 103 is exposed as shown in FIG. 18B, wherein an opening whose pattern matches the pattern of the opening 109a is formed in the insulating layer 104.

As shown in FIG. 18C, the photoresist 109 is removed, and vacuum evaporation or sputtering is performed to sequentially form films using a wiring material 111 and a thin-film element material 112 in association with the wiring layer 103 and the insulating layer 104.

Thereafter, patterning is performed on the wiring material 111 and the thin-film element material 112, thus forming the wiring 106 and the thin-film element 107 shown in FIG. 17. An insulating film is further formed on the insulating layer 104 and the thin-film element 107 and is then subjected to patterning so as to form an insulating film 108 in connection with peripheral ends of the thin-film element 107.

In order to realize desired characteristics of thin-film elements, which are formed on ICs in semiconductor devices, it is preferable to reduce dimensions of thin-film elements and wiring layers therefor in thickness; and it is preferable for wiring layers of thin-film elements to have planar surfaces. Such 'thin' wiring layers are formed to lie across openings having cross-sectionally rectangular shapes on ICs. This causes problems in that wiring layers become very thin in proximity to edges of openings and are therefore easy to break compared with normal wiring layers formed in semiconductor devices.

The aforementioned problems may be solved by reducing height differences before the formation of thin-film elements, wherein insulating layers are covered with planar insulating layers. However, it may be difficult to eliminate height differences between ICs and thin-film elements in proximity to edges of openings. That is, in the semiconductor device 101, the opening 105 has sharply rising walls in both sides thereof; hence, the wiring layer 106 may be easy to break in proximity to the opening 105. This reduces the reliability in manufacturing semiconductor devices.

The aforementioned drawback may be solved by forming the upper portion of the wall of the opening roughly in a semi-spherical shape or a tapered shape. This may reduce the possibility regarding breaks of the wiring layer; however, due to the sharpness of the lower portion of the wall of the opening, there remain possibilities in that the wiring layer may be easy to break in proximity to the opening and may be reduced in thickness inside of the opening, which causes reduction of the reliability in manufacturing semiconductor devices.

SUMMARY OF THE INVENTION

It is an object of the invention to provide a semiconductor wafer and a manufacturing method therefor, which reduces nonuniformity of resist application in IC regions by reducing height differences between IC regions and scribing lines formed on semiconductor substrates, wherein it is possible to improve precision of dimensions in the formation of thin-film elements in ICs, thus improving characteristics of thin-film elements.

It is another object of the invention to provide a semiconductor device and a manufacturing method therefore, wherein it is possible to prevent breaks from occurring in a wiring layer establishing an electrical connection between a thin-film element and an IC, whereby it is possible to improve the reliability in manufacturing semiconductor devices.

In a first aspect of the invention, a plurality of IC regions partitioned by scribing regions are formed on a semiconductor wafer so as to realize ICs having multilayer structures, and a plurality of seal rings are formed in peripheral areas of the ICs, wherein with respect to each of the IC regions, an uppermost wiring layer is formed together with a metal layer that is formed in the seal ring; a planar insulating layer is formed to cover the metal layer, IC, and scribing region; and a passivation film is formed on the planar insulating layer. This establishes a certain degree of planarity with respect to all of the IC, seal ring, and scribing region; hence, it is possible to eliminate the height difference between the IC and the scribing region. Thus, it is possible to reduce the nonuniformity of resist application with respect to the IC; hence, it is possible to improve precision of dimensions and characteristics of thin-film elements formed on the IC.

In the above, etching is performed to selectively remove a prescribed region of the planar insulating layer so as to expose a cavity substantially matching a hollow shape of the metal layer, and the passivation film is formed to cover the metal layer and the planar insulating layer. This causes the seal ring to partially break the planar insulating layer, which may act as the water infiltration path, whereby it is possible to prevent water from infiltrating into the IC.

In addition, etching is performed to selectively remove a prescribed region of the planar insulating layer so as to expose a planar portion of the metal layer, and the passivation film is formed to cover the metal layer and the planar insulating layer. Thus, it is possible to significantly reduce the height difference between the IC, seal ring, and scribing region.

Furthermore, etching is performed to substantially remove the planar insulating layer so as to realize a planar surface constituted by the metal layer and a remaining portion of the planar insulating layer, and the passivation film is formed on the planar surface. This establishes the complete planarity on the IC, seal ring, and scribing region; hence, it is possible to eliminate the height difference between the IC and scribing region. Due to the substantially complete removal of the planar insulating layer, it is possible to prevent water from infiltrating into the IC.

At least one thin-film element such as a magnetoresistive element is formed directly on the planar insulating layer or on the passivation film. This improves the integration between the IC and the thin-film element.

It is possible to further form a second protective insulating layer to cover the thin-film element, which is thus protected from the external environment. In addition, chemical mechanical polishing (CMP) can be performed on the surface of the planar insulating layer, which is thus improved in the degree of optical planarity on the order of nanometers.

In a second aspect of the invention, a semiconductor device is designed such that a thin-film element is formed on a wiring layer of an IC region formed on a semiconductor substrate via an insulating layer, wherein it is characterized in that an opening is formed to expose a part of the wiring layer, and a secondary wiring layer is formed in connection with the opening so as to establish an electric connection between the wiring layer and the thin-film element, and wherein the opening is formed in a step-like manner so that the wall thereof is gradually expanded from the bottom to the upper end thereof. This prevents the secondary wiring layer from being easily broken; hence, it is possible to avoid the occurrence of the initial characteristic failure such as the open failure, and it is possible to improve the reliability of the semiconductor device.

In the above, it is preferable that the insulating layer be realized by laminating a plurality of insulating layers. Herein, the opening area of the upper insulating layer is expanded compared with the opening area of the lower insulating layer. This prevents the secondary wiring layer from being broken even when the secondary wiring layer is reduced in thickness.

In addition, it is possible to modify the semiconductor device such that the opening area of the upper insulating layer is reduced compared with the opening area of the lower insulating layer, and the upper insulating layer is extended inwardly into the opening area of the lower insulating layer.

Furthermore, it is possible to modify the semiconductor device such that the insulating layer is realized by laminating three insulating layers, in which the opening area of the intermediate insulating layer is reduced compared with the opening area of the lower insulating layer, and the intermediate insulating layer is extended inwardly into the opening area of the lower insulating layer, and in which the opening area of the lower insulating layer is expanded compared with the opening area of the intermediate insulating layer.

In manufacture, a resist film having an opening whose wall is slanted and gradually expanded from the bottom to the upper end thereof is formed on the insulating layer, which is then subjected to selective removal using the resist film as a mask, thus forming an opening in the insulating layer, which is slanted and gradually expanded from the bottom to the upper end thereof. Herein, the wall of the opening of the resist film is slanted by a prescribed angle ranging from 20° to 80° about an axis lying in the thickness direction of the resist film. In addition, mixed gas including freon gas and oxygen gas is used for the selective removal of the insulating layer and for the etching forming the opening having a desired shape.

In a third aspect of the invention, a semiconductor device is designed such that a thin-film element is formed on a wiring layer of an IC region formed on a semiconductor substrate via an insulating layer in which a first opening and a second opening are respectively formed to partially expose the wiring layer at different positions, wherein a secondary wiring layer for establishing an electrical connection between the wiring layer and the thin-film element is formed in connection with the first opening so as to realize a thin-film element section, and the second wiring layer is partially exposed in the second opening so as to realize an external-terminal connection pad, which is separated from the thin-film element section. The first opening is gradually expanded in a step-like manner from the bottom to the upper end thereof, and the second opening is gradually expanded in a step-like manner from the bottom to the upper end thereof.

In the above, the insulating layer is realized by laminating a plurality of insulating layers in a manner similar to that of the second aspect.

In manufacture, the first opening is formed by covering the wiring layer with the insulating layer with respect to the external-terminal connection pad; then, the second opening is formed by removing the insulating layer covering the wiring layer with respect to the external-terminal connection pad. Herein, the insulating layer covering the wiring layer is removed using a resist film as a mask so as to form the second opening with respect to the external-terminal connection pad.

BRIEF DESCRIPTION OF THE DRAWINGS

These and other objects, aspects, and embodiments of the present invention will be described in more detail with reference to the following drawings, in which:

FIG. 4 is a cross-sectional view showing essential parts of a silicon wafer in accordance with a fourth modified example of the first embodiment of the invention;

FIG. 5 is a plan view showing an example of a silicon wafer;

FIG. 6 is an enlarged plan view showing a semiconductor chip having a magnetic sensor and its periphery;

FIG. 7 is a cross-sectional view taken along line A-A in FIG. 6;

FIG. 8 is a cross-sectional view showing a second example of the silicon wafer;

FIG. 9 is a cross-sectional view showing a third example of the silicon wafer;

DESCRIPTION OF THE PREFERRED EMBODIMENTS

This invention will be described in further detail by way of examples with reference to the accompanying drawings.

1. First Embodiment

Figure 1:
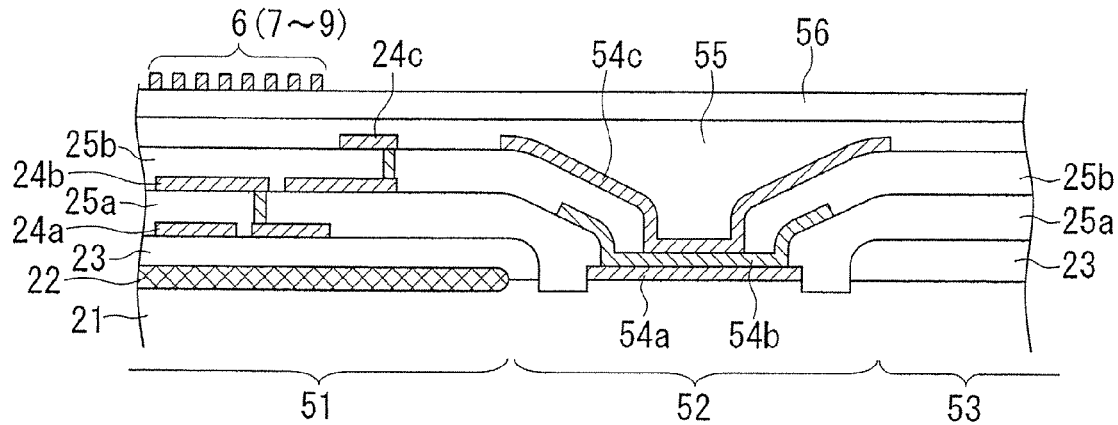
FIG. 1 is a cross-sectional view showing essential parts of a silicon wafer in accordance with a first embodiment of the invention.

FIG. 1 is a cross-sectional view showing essential parts of a silicon wafer (or a semiconductor wafer) in which a plurality of semiconductor devices (i.e., semiconductor chips having magnetic sensors) are formed in accordance with a first embodiment of the invention, wherein parts identical to those shown in FIG. 7 are designated by the same reference numerals.

In FIG. 1, reference numeral 51 designates an IC that is formed in an IC region of the p-type silicon substrate 21; reference numeral 52 designates a seal ring that is formed in the periphery of the IC 51; and reference numeral 53 designates a scribing line (or a scribing region) that is formed outside of the seal ring 52 in the boundary between adjacent IC regions.

An insulating layer 23 composed of silicon dioxide ($SiO_2$) is formed to cover the IC 51 and the scribing line 53 on the p-type silicon substrate 21; a wiring layer 24a having a prescribed wiring pattern composed of prescribed metals such as gold (Au) and aluminum (Al) is formed on the insulating layer 23; a metal layer 54a composed of the same materials of the wiring layer 24a is formed to cover the center portion of the seal ring 52; and an insulating layer 25a composed of $SiO_2$ is formed to cover both ends of the metal layer 54a in connection with the insulating layer 23 and the wiring layer 24a.

In addition, a wiring layer 24b having a prescribed wiring pattern composed of prescribed metals such as Au and Al is formed on the insulating layer 25a; a metal layer 54b composed of the same materials of the wiring layer 24b is formed such that the lower portion thereof comes in contact with the metal layer 54a; an insulating layer 25b is formed to cover the wiring layer 24b and the insulating layer 25a as well as the both ends of the metal layer 54b; GMR elements 6-9 and a wiring layer 24c are formed above the planar surface of the 'uppermost' insulating layer 25b; and a metal layer 54c composed of the same material of the 'uppermost' wiring layer 24c is formed to cover the center portion of the seal ring 52 such that the lower portion thereof comes in contact with the metal layer 54b.

Furthermore, a planar insulating layer 55 composed of $SiO_2$ is formed to cover the wiring layer 24c and the metal layer 54c; a passivation film (or a protective insulating layer) 56 which includes silicon nitride (i.e., $Si_3N_4$), is formed on the planar insulating layer 55; and the GMR elements 6-9 are formed on the passivation film 56.

As described above, the planar insulating layer 55 is arranged to cover all of the IC 51, seal ring 52, and scribing line 53 and is formed to have a planar surface, by which it is possible to eliminate the height difference between the IC 51 and the scribing line 53. This eliminates the nonuniformity of resist application even when a resist is applied onto the IC 51 in order to realize the further formation of thin-film elements; and it is possible to improve the precision of dimensions in the formation of thin-film elements further formed on the IC 51.

Next, a method of manufacturing a silicon wafer will be described in detail.

In accordance with the normal thin-film formation process, the insulating layer 23, wiring layer 24a, metal layer 54a, insulating layer 25a, wiring layer 24b, metal layer 54b, insulating layer 25b, GMR elements 6-9, wiring layer 24c, and metal layer 54c are sequentially formed on the p-type silicon substrate 21.

In accordance with the SOG (i.e., Spin On Glass) method, a liquid mainly composed of perhydropolysilazane is applied onto the wiring layer 24c and the metal layer 54c; then, the semiconductor chip is left alone for a prescribed time so as to realize leveling, thus forming a planar film. The planar film applied to the semiconductor chip is subjected to burning at 450° C. or so in the atmospheric air so as to form the planar insulating layer 55 composed of high-purity $SiO_2$. The surface of the planar insulating layer 55 has a superior degree of planarity.

In accordance with the chemical vapor deposition (CVD) method, the passivation film 56 composed of $Si_3N_4$ is formed to cover the planar insulating layer 55.

In the plasma CVD method, for example, a prescribed material such as $SiH_4$—$NH_3(N_2)$ or $SiH_4$—$N_2O$ is used to realize film formation at a film growth temperature of about 300° C.

Next, the GMR elements 6-9 are formed on the passivation film 56.

Thereafter, a second protective insulating layer (not shown) is formed to cover the GMR elements 6-9.

In the aforementioned manufacturing method, the planar insulating layer 55 is formed to entirely cover the wiring layer 24c and the metal layer 54c; thus, it is possible to eliminate the height difference between the IC 51 and the scribing line 53. This facilitates the production of a silicon wafer having no height difference between the IC 51 and the scribing line 53.

In addition, the aforementioned liquid mainly composed of perhydropolysilazane is applied onto the wiring layer 24c and the metal layer 54c; then, the semiconductor chip is subjected to burning at 450° C. or so in the atmospheric air, thus forming the planar insulating layer 55 composed of high-purity $SiO_2$. Thus, it is possible to produce the planar insulating layer 55 whose surface has a superior degree of planarity.

According to the silicon wafer of the present embodiment, the planar insulating layer 55 having the planar surface is formed to entirely cover the IC 51, seal ring 52, and scribing line 53, whereby it is possible to eliminate the height difference between the IC 51 and the scribing line 53. This reduces the nonuniformity of resist application even when a resist is applied to the IC 51 in order to realize the further formation of thin-film elements; therefore, it is possible to improve the precision of dimensions in the formation of thin-film elements on the IC 51.

According to the manufacturing method of the silicon wafer of the present embodiment, the planar insulating layer 55 is formed to entirely cover the IC 51, seal ring 52, and scribing line 53; therefore, it is possible to produce the silicon wafer having no height difference between the IC 51 and the scribing line 53.

In addition, the liquid mainly composed of perhydropolysilazane is applied onto the IC 51, seal ring 52, and scribing line 53; then, the semiconductor chip is subjected to burning at 450° C. or so in the atmospheric air so as to form the planar insulating layer 55 composed of high-purity $SiO_2$, whereby it is possible to easily produce the planar insulating layer 55 whose surface has a superior degree of planarity.

Next, modified examples of the present embodiment will be described in detail.

A first modified example will be described with regard to the manufacturing method of a silicon wafer with reference to FIG. 1.

In accordance with the normal thin-film formation process, the insulating layer 23, wiring layer 24a, metal layer 54a, insulating layer 25a, wiring layer 24b, metal layer 54b, insulating layer 25b, wiring layer 24c, and metal layer 54c are sequentially formed on the p-type silicon substrate 21.

In accordance with the CVD method, a prescribed material of $SiH_4$—$O_2$ is processed to form the planar insulating layer 55 composed of $SiO_2$, which covers the wiring layer 24c and the metal layer 54c.

Irregularities are formed on the surface of the planar insulating layer 55 in correspondence with projections and hollows formed on the insulating layer 25b, wiring layer 24c, and metal layer 54c. Chemical mechanical polishing (CMP) is performed on the entire surface of the planar insulating layer 55, which is thus made completely planar.

The CMP is performed in such a way that a silicon wafer (which is a polished subject) is arranged on a polishing head; slurry, in which fine particles composed of $SiO_2$ and cerium oxide ($CeO_2$) are dispersed in alkaline solution such as potassium hydroxide (KOH) and/or aqueous ammonia ($NH_4OH$), is subjected to dripping onto a polishing pad that is equipped with a fraise; the silicon wafer is rotated at a prescribed angular velocity under a prescribed pressure, so that it revolves on the fraise rotating at a different angular velocity.

Thus, it is possible to polish the surface of the planar insulating layer 55, which thus has a high degree of optical planarity on the order of nanometers.

In accordance with the CVD method, the passivation film 56 including $Si_3N_4$ is formed to cover the planar insulating layer 55. In the plasma CVD process, for example, a prescribed material of $SiH_4$—$NH_3(N_2)$ or $SiH_4$—$N_2O$ is used for the film formation at a film growth temperature of 300° C.

As described above, it is possible to produce the silicon wafer in which no height difference is formed between the IC 51 and the scribing line 53.

According to the aforementioned manufacturing method, the planar insulating layer 55 is formed to cover the IC 51, seal ring 52, and scribing line 53; then, the surface of the planar insulating layer 55 is subjected to planarization; hence, it is possible to easily produce the silicon wafer having no height difference between the IC 51 and the scribing line 53.

The CMP is performed to polish the entire surface of the planar insulating layer 55, whereby it is possible to easily process the planar insulating layer 55 to have a high degree of optical planarity on the order of nanometers. This makes it easy to produce the silicon wafer having no height difference between the IC 51 and the scribing line 53.

Instead of the CMP performed on the entire surface of the planar insulating layer 55, it is possible to perform the CMP on the surface of the passivation film 56. In this case, it is possible to easily produce the silicon wafer having no height difference between the IC 51 and the scribing line 53.

Figure 2:
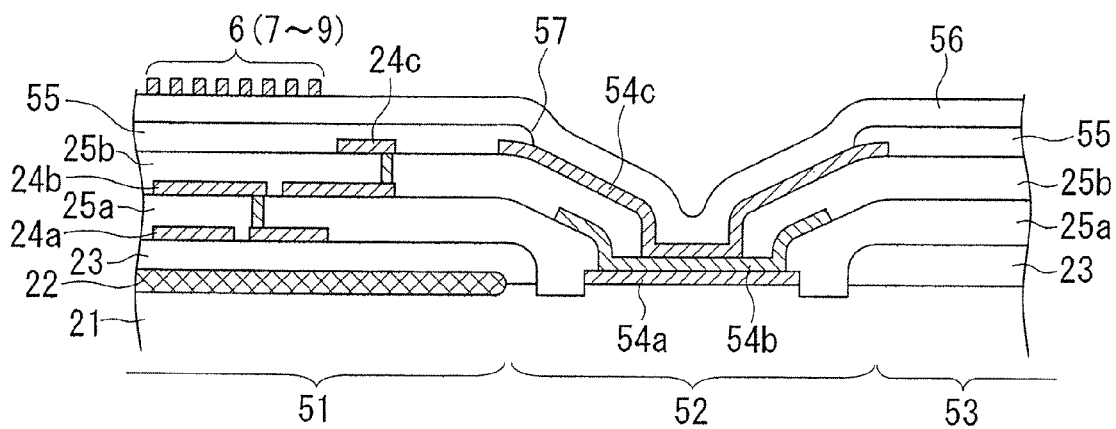
FIG. 2 is a cross-sectional view showing essential parts of a silicon wafer in accordance with a second modified example of the first embodiment of the invention.

Next, a second modified example will be described with reference to FIG. 2, which is a cross-sectional view showing essential parts of a silicon wafer on which a plurality of semiconductor devices (i.e., semiconductor chips having magnetic sensors) are formed. Compared with the silicon wafer of FIG. 1 in which the planar insulating layer 55 is formed to entirely cover the metal layer 54c, and the passivation film 56 is formed on the entire surface of the planar insulating layer 55, the silicon wafer of FIG. 2 is characterized in that dry etching is performed to selectively remove a prescribed region of the planar insulating layer 55 above the metal layer 54c so as to form a window 57, by which a cavity is exposed in correspondence with the scribing region of the metal layer 54*c*, so that the passivation film 56 is formed to cover the 'remaining' planar insulating layer 55 and the 'exposed' metal layer 54*c*.

A manufacturing method of the silicon wafer of FIG. 2 will be described in detail.

In accordance with the aforementioned steps used in the present embodiment (see FIG. 1), the planar insulating layer 55 is formed to entirely cover the metal layer 54*c*. Then, dry etching is performed to selectively remove a prescribed region of the planar insulating layer 55 above the metal layer 54*c*, thus exposing the cavity in correspondence with the scribing region of the metal layer 54*c*. Thereafter, the plasma CVD method is performed to form the passivation film 56 to cover the planar insulating layer 55 and the exposed metal layer 54*c*. Thus, it is possible to produce the silicon wafer of FIG. 2 having no height difference between the IC 51 and the scribing line 53.

According to the second modified example of the silicon wafer in which the planar insulating layer 55 entirely covers the IC 51 and the scribing line 53, it is possible to eliminate the height difference between the IC 51 and the scribing line 53.

In addition, the second modified example is characterized in that dry etching is performed to selectively remove a prescribed region of the planar insulating layer 55 above the metal layer 54*c*, and the passivation film 56 is formed to directly cover the exposed metal layer 54*c*. This causes the seal ring 52 to partially break the planar insulating layer 55, which may act as the water infiltration path; hence, it is possible to prevent water from infiltrating into the IC 51.

Furthermore, according to the manufacturing method of the silicon wafer of the second modified example, the planar insulating layer 55 is subjected to etching so as to expose the cavity in correspondence with the scribing region of the metal layer 54*c*, wherein the passivation film 56 is formed to cover the exposed metal layer 54*c*. Thus, it is possible to easily produce the silicon wafer having no height difference between the IC 51 and the scribing line 53, which also eliminates the possibility that water will infiltrate into the IC 51.

Next, a third modified example will be described with reference to FIG. 3, which is a cross-sectional view showing essential parts of a silicon wafer on which a plurality of semiconductor devices (i.e., semiconductor chips having magnetic sensors) are formed. Compared with the silicon wafer of FIG. 1 in which the planar insulating layer 55 is formed to entirely cover the metal layer 54*c*, and the passivation film 56 is formed on the entire surface of the planar insulating layer 55, the silicon wafer of FIG. 3 is characterized in that dry etching is performed to selectively remove a prescribed region of the planar insulating layer 55 above the relatively planar portion of the metal layer 54*c* so as to form a window 58, by which the relatively planar portion of the metal layer 54*c* is exposed; then, the passivation film 56 is formed to cover the planar insulating layer 55 and the exposed portion of the metal layer 54*c*.

In the above, the relatively planar portion of the metal layer 54*c* corresponds to the boundary between the scribing region and the IC region with respect to the metal layer 54*c*, wherein the metal layer 54 is partially made planar.

Figure 3:
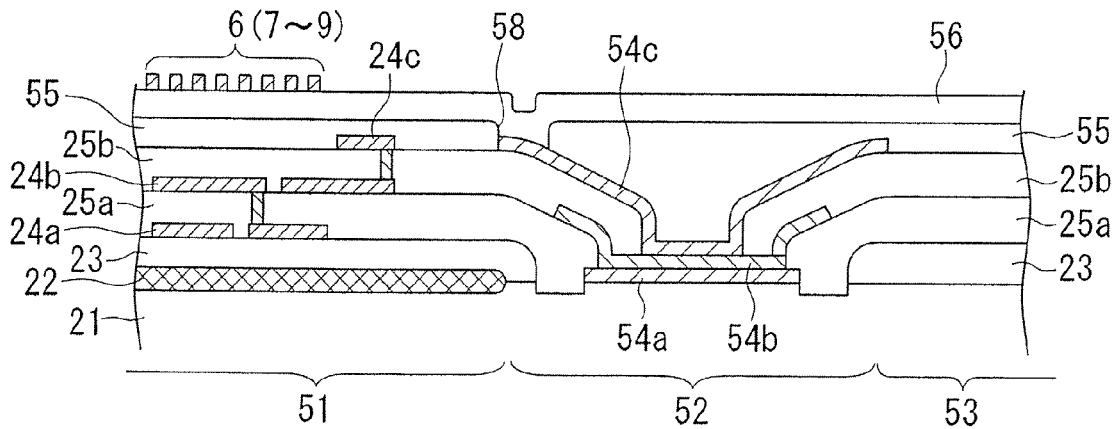
FIG. 3 is a cross-sectional view showing essential parts of a silicon wafer in accordance with a third modified example of the first embodiment of the invention.

In the silicon wafer of FIG. 3, the planar insulating layer 55 entirely covers the IC 51; it covers most of the seal ring 52; and it entirely covers the scribing line 53; hence, it is possible to extremely reduce the height difference between the IC 51 and the seal ring 52.

In addition, etching is performed to selectively remove the prescribed region of the planar insulating layer 55 above the relatively planar portion of the metal layer 54*c*, and the passivation film 56 is formed to directly cover the exposed portion of the metal layer 54*c*. This causes the seal ring 52 to partially break the planar insulating layer 55, which may act as the water infiltration path; hence, it is possible to prevent water from infiltrating into the IC 51.

Next, a fourth modified example will be described with reference to FIG. 4, which is a cross-sectional view showing essential parts of a silicon wafer on which a plurality of semiconductor devices (i.e., semiconductor chips having magnetic sensors) are formed. Compared with the silicon wafer of FIG. 1 in which the planar insulating layer 55 entirely covers the metal layer 54*c*, and the passivation film 56 is formed on the entire surface of the planar insulating layer 55, the silicon wafer of FIG. 4 is characterized in that dry etching is performed on the planar insulating layer 55 in its certain depth so as to expose the surface of the metal layer 54*c*, which is made identical in level to the surface of the planar insulating layer 55, and the passivation film 56 is formed on the entirely planar surface so as to cover the remaining portion of the planar insulating layer 55 and the metal layer 54*c*.

In the silicon wafer of FIG. 4, the planar insulating layer 55 entirely covers the IC 51, seal ring 52, and scribing line 53; hence, it is possible to eliminate the height difference between the IC 51 and the seal ring 52.

This causes the seal ring 52 to partially break the planar insulating layer 55, which may act as the water infiltration path, by the metal layer 54*c*; hence, it is possible to prevent water from infiltrating into the IC 51.

2. Second Embodiment

Figure 10:
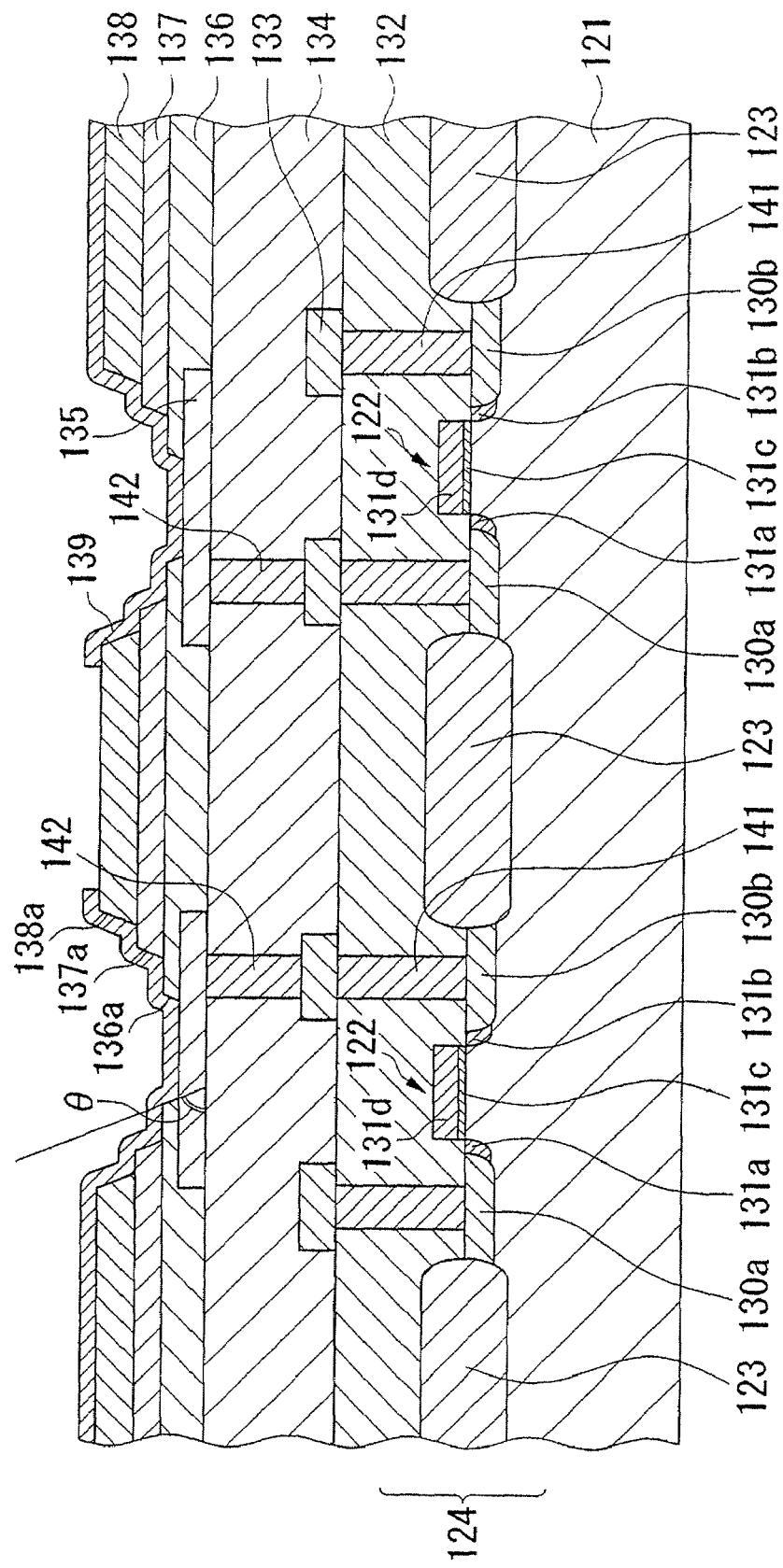
FIG. 10 is a cross-sectional view showing essential parts of a semiconductor device having thin-film elements in accordance with a second embodiment of the invention.

FIG. 10 is a cross-sectional view showing essential parts of a semiconductor device having thin-film elements in accordance with a second embodiment of the invention, wherein reference numeral 121 designates a p-type silicon substrate (or a semiconductor substrate); reference numerals 122 designate transistors formed on the silicon substrate; and reference numerals 123 designate field insulating films composed of silicon oxide, which are formed between the transistors 122. Herein, an IC region 124 includes the transistors 122, field insulating films 123, and peripheral circuits and other elements (not shown), which are formed on the silicon substrate 121.

The transistors 122 are each constituted by sources 130*a* and drains 130*b*, which are formed on the silicon substrate 121, and gates 131*d* that are formed above the lightly doped source regions 131*a* and lightly doped drain regions 131*b* on $SiO_2$ films (or gate insulating films) 131*c*.

On the IC region 124, there are sequentially formed an insulating layer 132 composed of silicon oxide, a first wiring layer 133 having a prescribed pattern composed of Al, Ti, TiN, W, and Cu, an insulating layer 134 composed of silicon oxide that covers the insulating layer 132 and the first wiring layer 133, and a second wiring layer 135 having a prescribed pattern composed of Al, Ti, TiN, W, and Cu, as well as insulating layers 136, 137, and 138 composed of silicon oxide, silicon nitride, or lamination of silicon oxide and silicon nitride, which are laminated together so as to cover the insulating layer 134 and the second wiring layer 135. In addition, contacts 141, composed of Al, Ti, TiN, W, and Cu, for establishing electric connections between the n+ source and drain layers 130*a* and 130*b* and the first wiring layer 133 are embedded in the insulating layer 132. Furthermore, vias 142, composed of Al, Ti, TiN, W, and Cu, for establishing electric connections between the first wiring layer 133 and the second wiring layer 135 are embedded in the insulating layer 134.

Openings 136a, 137a, and 138a are respectively formed in the insulating layers 136, 137, and 138 so as to partially expose the upper surface of the second wiring layer 135. The wall of the opening 136a is slanted in such a way that the opened area of the opening 136a is gradually expanded from the bottom to the upper end, wherein the slanted wall of the opening 136a has a slanted angle θ that ranges from 20° to 80° against the bottom of the insulating layer 136.

The opened area of the opening 137a is expanded to form a step-like portion above the opening 136a, wherein the wall of the opening 137a is slanted in such a way that the opened area is gradually expanded from the bottom to the upper end, and wherein the slanted angle of the slanted wall of the opening 137a ranges from 20° to 80° against the bottom of the insulating layer 137.

Similarly, the opened area of the opening 138a is expanded to form a step-like portion above the openings 136a and 137a, wherein the wall of the opening 138a is slanted in such a way that the opened area is gradually expanded from the bottom to the upper end, and wherein the slanted angle of the slanted wall of the opening 138a ranges from 20° to 80° against the bottom of the insulating layer 138.

A wiring layer 139 for establishing electric connection between a thin-film element (not shown), which is formed on the insulating layer 138, and the second wiring layer 135 is formed on the walls of the opening 136a to 138a and the upper surface of the second wiring layer 135.

In the semiconductor device having the thin-film element described above, the walls of the openings 136a to 138a, which expose the upper surface of the second wiring layer 135, are formed in a step-like manner and are each slanted against the bottoms of the insulating layers 136 to 138 by prescribed slanted angles ranging from 20° to 80°. This increases the thickness of the wiring layer 139 that is formed on the walls of the openings 136a to 138a; hence, it is possible to reliably prevent the wiring layer 139 for the thin-film element from being broken. In addition, it is possible to avoid the occurrence of initial characteristic failure such as open failure due to failure of the wiring layer 139; hence, it is possible to improve the reliability of semiconductor devices having thin-film elements.

Next, a method for forming the openings 136a to 138a will be described in detail.

Figure 11A:
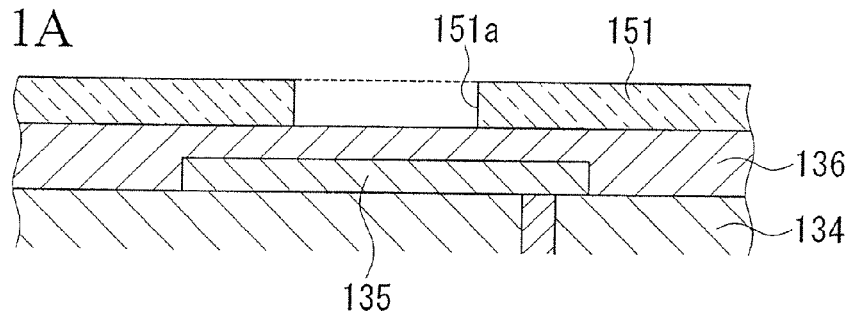
FIG. 11A is a cross-sectional view showing a first step for manufacturing the semiconductor device shown in FIG. 10.

As shown in FIG. 11A, the insulating layer 136 is formed to entirely cover the insulating layer 134 and the second wiring layer 135; a resist film 151 is formed on the insulating layer 136; then, the resist film 151 is subjected to patterning using a mask, thus forming an opening 151a at a prescribed position of the resist film 151.

The resist film 151 is exposed to light whose wavelength ranges from 100 mm to 500 nm, preferably, from 140 nm to 450 mm, for a prescribed time period ranging from 100 msec to 2000 msec; then, the semiconductor device is subjected to heating using a heating device (e.g., a hot plate or an oven) at a prescribed temperature ranging from 120° C. to 200° C. for a prescribed time ranging from 1 min to 60 min.

Figure 11B:
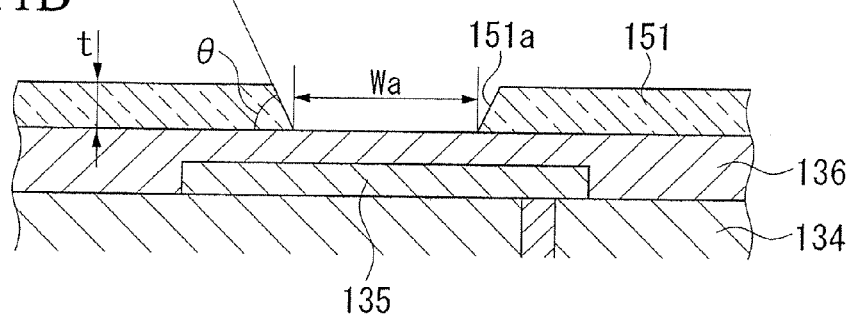
FIG. 11B is a cross-sectional view showing a second step for manufacturing the semiconductor device shown in FIG. 10.

Thus, it is possible to produce the resist film 151 as shown in FIG. 11B, in which thickness t ranges from 500 nm to 3000 nm; width Wa of the opening 151a ranges from 1 nm to 100 nm, preferably from 10 nm to 50 nm, and optimally 20 nm; slanted angle θ of the wall of the opening 151a ranges from 20° to 80° against the bottom of the resist film 151.

Figure 11C:
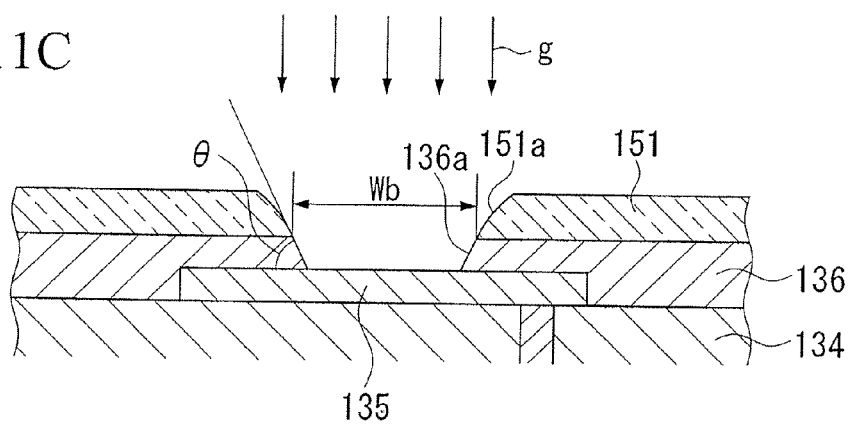
FIG. 11C is a cross-sectional view showing a third step for manufacturing the semiconductor device shown in FIG. 10.

As shown in FIG. 11C, etching is performed on the insulating layer 136 using the resist film 151 as a mask, wherein the insulating layer 136 is exposed to etching gas (or selective removal gas) g including freon gas and oxygen gas.

Specifically, the etching gas g is realized as mixed gas having a prescribed composition including $CF_4$ ranging from 20 sccm to 80 sccm, $CHF_3$ ranging from 60 sccm to 200 sccm, and $O_2$ ranging from 80 sccm to 120 sccm.

Preferably, the mixed gas has a composition including $CF_4$ of 60 sccm, $CHF_3$ of 180 sccm, and $O_2$ of 100 sccm or a composition including $CF_4$ of 30 sccm, $CHF_3$ of 180 sccm, and $O_2$ of 100 sccm.

In the above, the wall of the opening 151a of the resist film 151 is slanted so that when the etching gas g is sprayed from the upper position of the resist film 151 to the insulating layer 136, it causes erosion of the resist in the periphery of the opening 151a, which is thus gradually expanded in width from Wa to Wb. That is, the opening 151a of the resist film 151 is expanded by etching, whereby the opened area of the opening 136a is gradually expanded as the opening 151a of the resist film 151, which is reduced in dimensions. As a result, the wall of the opening 136a is slanted by the slanted angle θ ranging from 20° to 80° against the bottom of the insulating layer 136.

Figure 11D:
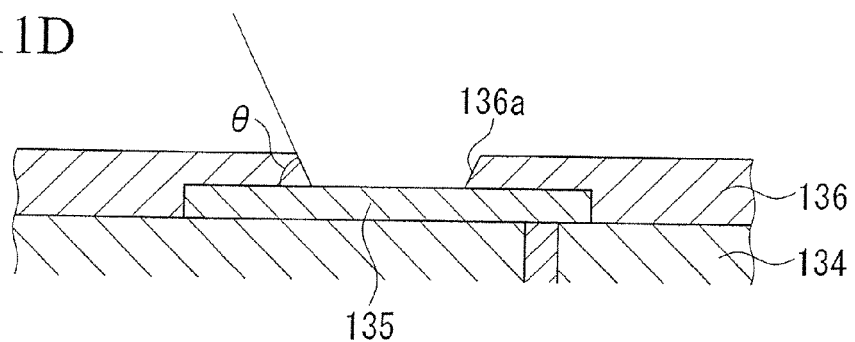
FIG. 11D is a cross-sectional view showing a fourth step for manufacturing the semiconductor device shown in FIG. 10.

Thereafter, the resist film 151 is completely removed. Thus, as shown in FIG. 11D, it is possible to form the insulating layer 136 having the opening 136a whose wall is slanted by the slanted angle θ ranging from 20° to 80° against the bottom of the insulating layer 136.

By repeating the aforementioned steps, it is possible to sequentially form the insulating layer 137 having the opening 137a and the insulating layer 138 having the opening 138a above the insulating layer 136 having the opening 136a by use of different masks (realized by resist films) matching dimensions of the openings 137a and 138a respectively.

As described above, the semiconductor device having thin-film elements according to the present embodiment is characterized in that the walls of the openings 136a to 138a, by which the upper surface of the second wiring layer 135 is exposed, are formed in a step-like manner and are each slanted by the slanted angle ranging from 20° to 80° against the bottoms of the insulating layers 136 to 138 respectively. This increases the thickness of the wiring layer 139 formed on the walls of the openings 136a to 138a; hence, it is possible to prevent the wiring layer 139 from being broken, and it is possible to avoid the occurrence of the initial characteristic failure such as the open failure due to the failure of the wiring layer 139. Therefore, it is possible to improve the reliability of wiring regarding thin-film elements in semiconductor devices, which are thus improved in reliability.

According to the manufacturing method as shown in FIGS. 11A to 11D, etching is performed on the insulating layer 136 by use of a mask corresponding to the resist film 151 having the opening 151a whose wall is slanted by the slanted angle θ ranging from 20° to 80° against the bottom of the insulating layer 136; hence, it is possible to easily process the insulating layer 136 to have the opening 136a whose wall is slanted by the slanted angle θ ranging from 20° to 80° against the bottom of the insulating layer 136.

Thus, it is possible to prevent the wiring layer 139 for the thin-film element from being broken; and it is possible to easily produce semiconductor devices having thin-film elements that is improved in reliability in terms of wiring.

Next, a modified example of the second embodiment will be described in detail.

Figure 12:
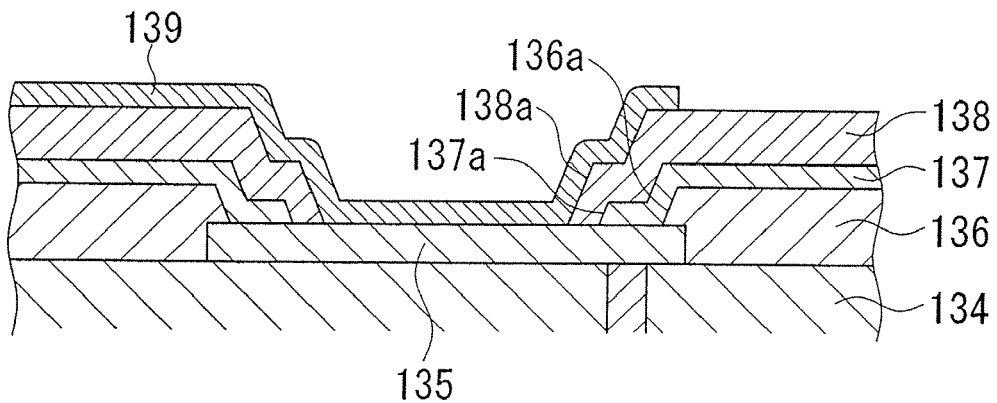
FIG. 12 is a cross-sectional view showing essential parts of a semiconductor device in accordance with a first modified example of the second embodiment of the invention.

FIG. 12 is a cross-sectional view showing essential parts of a semiconductor device in accordance with a first modified example of the second embodiment of the invention. Compared with the semiconductor device of the second embodiment shown in FIG. 10 in which the openings 136a to 138a are gradually expanded outwardly in a step-like manner in such a way that the opening 137a of the intermediate insulating layer 137 is opened outside of the opening 136a of the lowermost insulating layer 136, and the opening 138a of the uppermost insulating layer 138 is opened outside of the opening 137a of the intermediate insulating layer 137, the semiconductor device of FIG. 12 is characterized in that the openings 136a to 138a are inwardly reduced in a step-like manner in which the opening 137a of the intermediate insulating layer 137 is opened inside of the opening 136a of the lowermost insulating layer 136, and the opening 138a of the uppermost insulating layer 138 is opened inside of the opening 137a of the intermediate insulating layer 137.

The aforementioned openings 136a to 138a shown in FIG. 12 can be formed in accordance with steps similar to the foregoing steps for forming the openings 136a to 138a shown in FIG. 10. Herein, it is necessary to use masks having patterns realizing the openings 136a, 137a, and 138a shown in FIG. 12.

According to the first modified example shown in FIG. 12, similarly to the second embodiment shown in FIG. 10, it is possible to increase the thickness of the wiring layer 139 formed on the walls of the openings 136a to 138a; therefore, it is possible to prevent the wiring layer 139 for the thin-film element from being broken; hence, it is possible to avoid the occurrence of the initial characteristic failure such as the open failure due to the failure of the wiring layer 139. As a result, it is possible to improve the reliability in wiring; and it is possible to improve the reliability in manufacturing semiconductor devices having thin-film elements.

Figure 13:
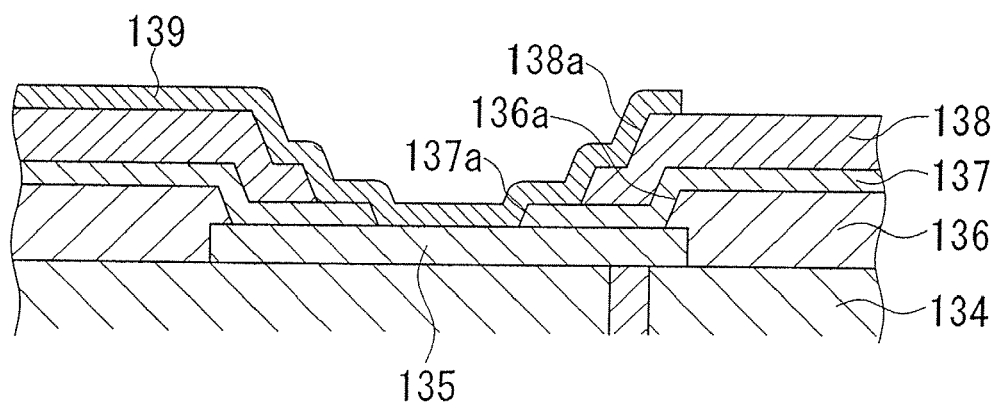
FIG. 13 is a cross-sectional view showing essential parts of a semiconductor device in accordance with a second modified example of the second embodiment of the invention.

FIG. 13 is a cross-sectional view showing essential elements of a semiconductor element having a thin-film element in accordance with a second modified example of the second embodiment of the invention. Compared with the semiconductor device of FIG. 10 in which the openings 136a to 138a are expanded outwardly in a step-like manner in which the opening 137a of the intermediate insulating layer 137 is opened relative to the opening 136a of the lowermost insulating layer 136, and the opening 138a of the uppermost insulating layer 138 is opened relative to the opening 137a of the intermediate insulating layer 137, the semiconductor device of FIG. 13 is characterized in that the opening 137a of the intermediate insulating layer 137 is opened inwardly of the opening 136a of the lowermost insulating layer 136, and the opening 138a of the uppermost insulating layer 138 is opened outwardly of the opening 137a of the intermediate insulating layer 137 and is inwardly of the opening 136a of the lowermost insulating layer 136.

The aforementioned openings 136a to 138a shown in FIG. 13 can be formed in steps similar to the foregoing steps for forming the openings 136a to 138a shown in FIG. 10. Herein, it is necessary to use masks having patterns realizing the openings 136a, 137a, and 138a shown in FIG. 13.

According to the second modified example shown in FIG. 13, similarly to the second embodiment shown in FIG. 10, it is possible to increase the thickness of the wiring layer 139 formed on the walls of the openings 136a to 138a; therefore, it is possible to prevent the wiring layer 139 for the thin-film element from being broken; hence, it is possible to avoid the occurrence of the initial characteristic failure such as the open failure due to the failure of the wiring layer 139. As a result, it is possible to improve the reliability in wiring; and it is possible to improve the reliability in manufacturing semiconductor devices having thin-film elements.

Figure 14:
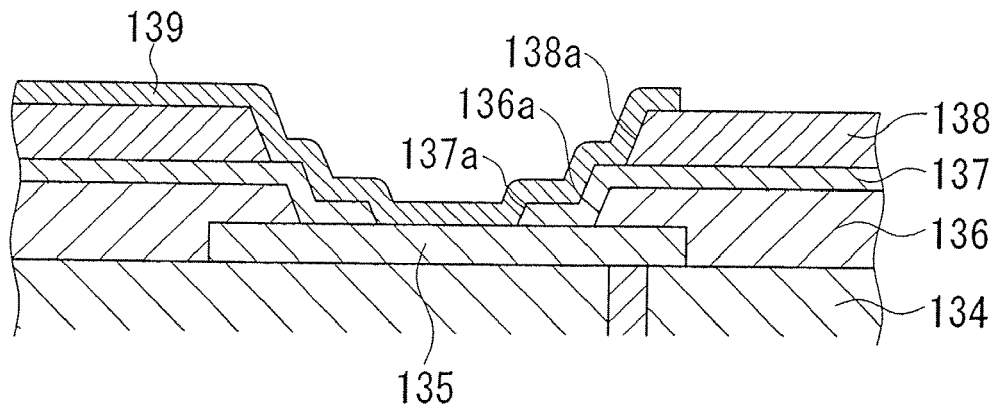
FIG. 14 is a cross-sectional view showing essential parts of a semiconductor device in accordance with a third modified example of the second embodiment of the invention.

FIG. 14 is a cross-sectional view showing essential parts of a semiconductor device in accordance with a third modified example of the second embodiment of the invention. Compared with the semiconductor device of FIG. 10 in which the openings 136a to 138a are expanded outwardly in a step-like manner in which the opening 137a of the intermediate insulating layer 137 is opened relative to the opening 136a of the lowermost insulating layer 136, and the opening 138a of the uppermost insulating layer 138 is opened relative to the opening 137a of the intermediate insulating layer 137, the semiconductor device of FIG. 14 is characterized in that the opening 137a of the intermediate insulating layer 137 is opened inwardly of the opening 136a of the lowermost insulating layer 136, and the opening 138a of the uppermost insulating layer 138 is opened inwardly of the opening 137a of the intermediate insulating layer 137 and the opening 136a of the lowermost insulating layer 136 respectively.

The aforementioned openings 136a to 138a shown in FIG. 14 can be formed in steps similar to the foregoing steps for forming the openings 136a to 138a shown in FIG. 10. Herein, it is necessary to use masks having patterns realizing the openings 136a, 137a, and 138a shown in FIG. 14.

According to the third modified example shown in FIG. 14, similarly to the second embodiment shown in FIG. 10, it is possible to increase the thickness of the wiring layer 139 formed on the walls of the openings 136a to 138a; therefore, it is possible to prevent the wiring layer 139 for the thin-film element from being broken; hence, it is possible to avoid the occurrence of the initial characteristic failure such as the open failure due to the failure of the wiring layer 139. As a result, it is possible to improve the reliability in wiring; and it is possible to improve the reliability in manufacturing semiconductor devices having thin-film elements.

3. Third Embodiment

Figure 15:
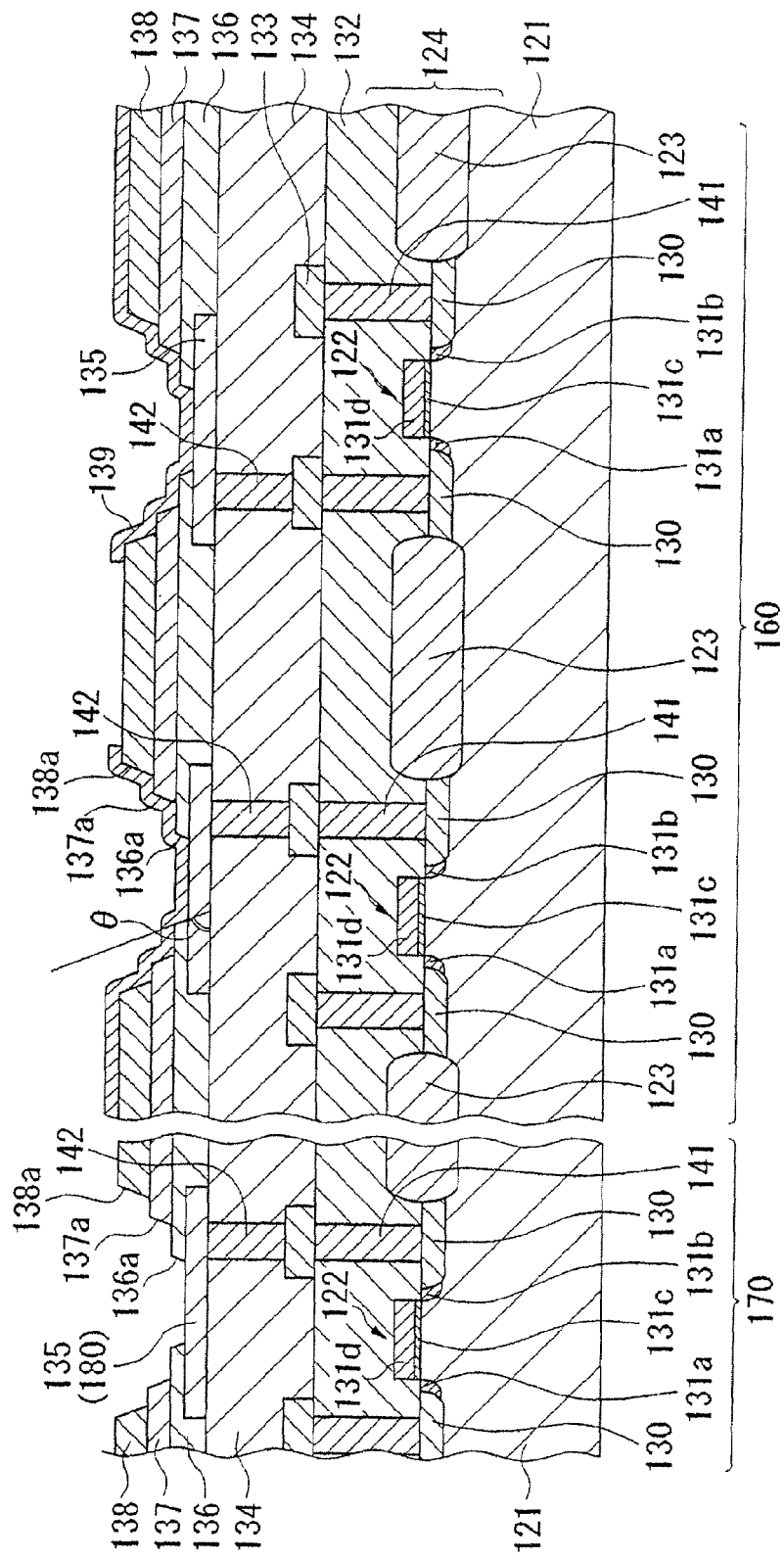
FIG. 15 is a cross-sectional view showing essential parts of a semiconductor device having thin-film elements in accordance with a third embodiment of the invention.

FIG. 15 is a cross sectional view showing essential parts of a semiconductor device having thin films in accordance with a third embodiment of the invention, wherein parts identical to those shown in FIG. 10 are designated by the same reference numerals; hence, the detailed description thereof is omitted. Compared with the semiconductor device of the second embodiment shown in FIG. 10 in which the wiring layer 139 for establishing electric connection between the second wiring layer 135 and a thin-film element (not shown) is formed in the openings 136a to 138a, the semiconductor device of the third embodiment shown in FIG. 15 is characterized in that it includes a thin-film element section 160, in which the wiring layer 139 for establishing electric connection between the second wiring layer and a thin-film element (not shown) is formed in the openings 136a to 138a, and an external-terminal connection pad 170 in which an external-terminal electrode 180 is formed in openings 136a to 138a.

Specifically, the semiconductor device of FIG. 15 has plural sets of the openings 136a to 138a, among which the thin-film element section 160 is formed with respect to the prescribed sets of the openings 136a to 138a, and the external-terminal connection pad 170 is formed with respect to the other sets of the openings 136a to 138a. In addition, the semiconductor device also includes test pads and dummy pads (both not shown) with respect to the remaining sets of the openings 136a to 138a.

In the external-terminal connection pad 170, the openings 136a to 138a are gradually expanded outwardly in a step-like manner such that the opening 137a of the intermediate insulating layer 137 is opened relative to the opening 136a of the lowermost insulating layer 136, and the opening 138a of the uppermost insulating layer 138 is opened relative to the opening 137a of the intermediate insulating layer 137. Of course, it is possible to modify the relationship between the openings 136a to 138a as shown in FIGS. 12 to 14.

According to the third embodiment shown in FIG. 15, similarly to the second embodiment shown in FIG. 10, it is possible to increase the thickness of the wiring layer 139 formed on the walls of the openings 136a to 138a; therefore, it is possible to prevent the wiring layer 139 for the thin-film element from being broken; hence, it is possible to avoid the occurrence of the initial characteristic failure such as the open failure due to the failure of the wiring layer 139. As a result, it is possible to improve the reliability in wiring; and it is possible to improve the reliability in manufacturing semiconductor devices having thin-film elements.

Next, a manufacturing method for the semiconductor device of the third embodiment will be described with reference to FIGS. 16A to 16I.

In the manufacturing method, an overall insulating layer is constituted by the insulating layers 136 to 138, wherein when the openings 136a to 138a are formed by partially exposing the second wiring layer 135 with respect to the thin-film element section 160, the second wiring layer 135 for the external-terminal connection pad 170 is covered with the insulating layer; then, the insulating layer covering the second wiring layer 135 for the external-terminal connection pad 170 is partially removed so as to form the openings 136a to 138a with respect to the external-terminal connection pad 170. In FIGS. 16A to 16I, the overall opening width for the external-terminal connection pad 170 ranges from 80 μm to 100 μm, and the overall opening width for the thin-film element section 160 is set to approximately 10 μm, for example.

Figure 16:
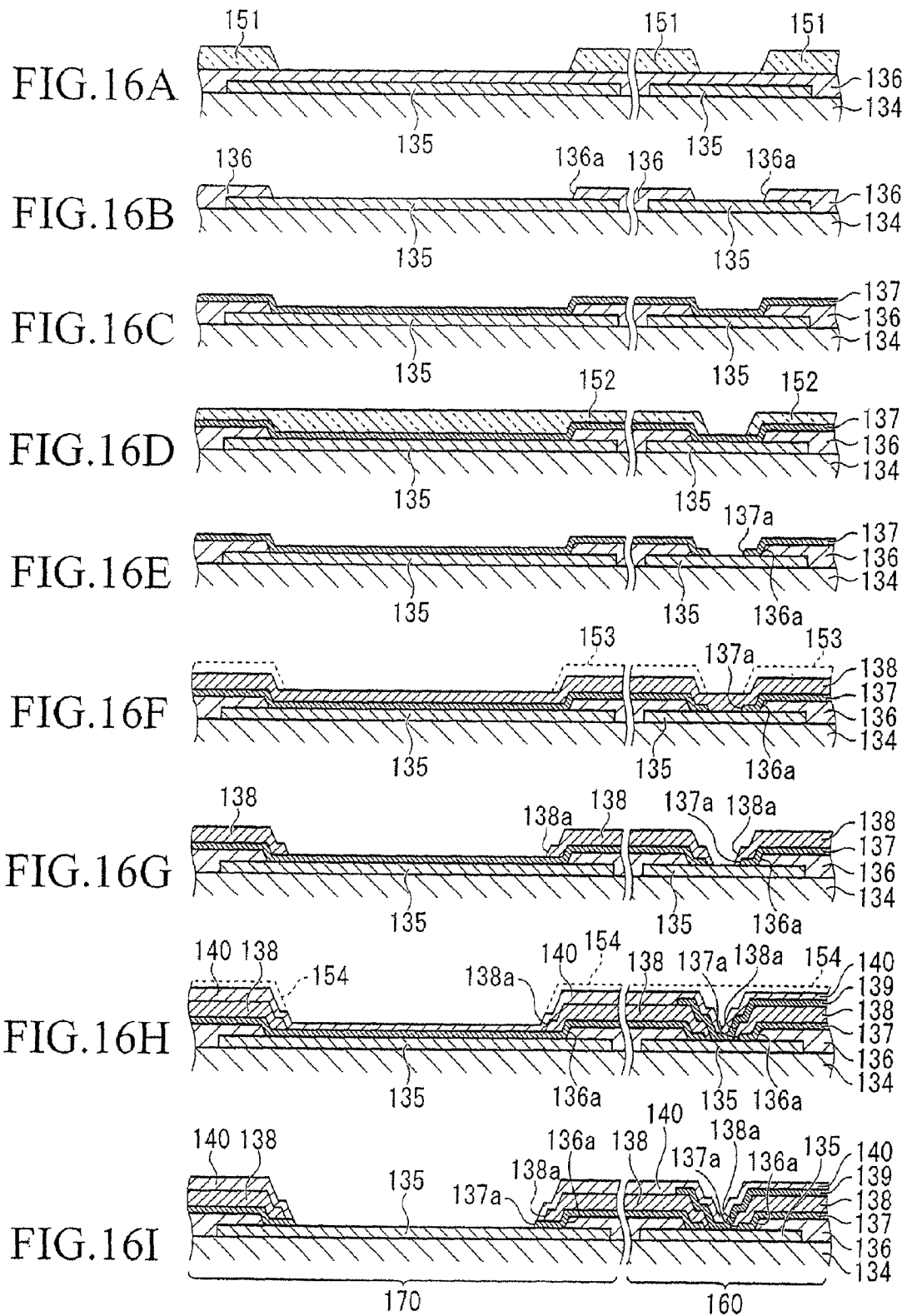
FIG. 16A is a cross-sectional view showing a first step for manufacturing the semiconductor device shown in FIG. 15.
FIG. 16B is a cross-sectional view showing a second step for manufacturing the semiconductor device shown in FIG. 15.
FIG. 16C is a cross-sectional view showing a third step for manufacturing the semiconductor device shown in FIG. 15.
FIG. 16D is a cross-sectional view showing a fourth step for manufacturing the semiconductor device shown in FIG. 15.
FIG. 16E is a cross-sectional view showing a fifth step for manufacturing the semiconductor device shown in FIG. 15.
FIG. 16F is a cross-sectional view showing a sixth step for manufacturing the semiconductor device shown in FIG. 15.
FIG. 16G is a cross-sectional view showing a seventh step for manufacturing the semiconductor device shown in FIG. 15.
FIG. 16H is a cross-sectional view showing an eighth step for manufacturing the semiconductor device shown in FIG. 15.
FIG. 16I is a cross-sectional view showing a ninth step for manufacturing the semiconductor device shown in FIG. 15.
Figure 17:
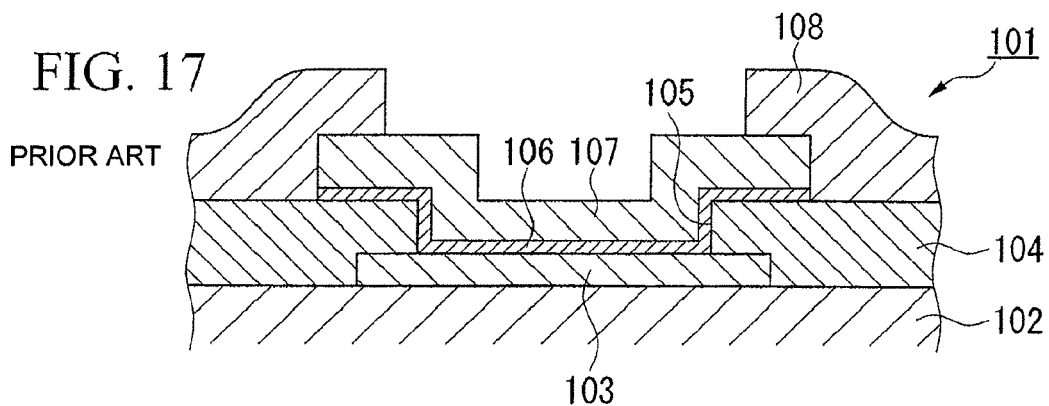
FIG. 17 is a cross-sectional view showing an example of a semiconductor device having a thin-film element.
Figure 18A:
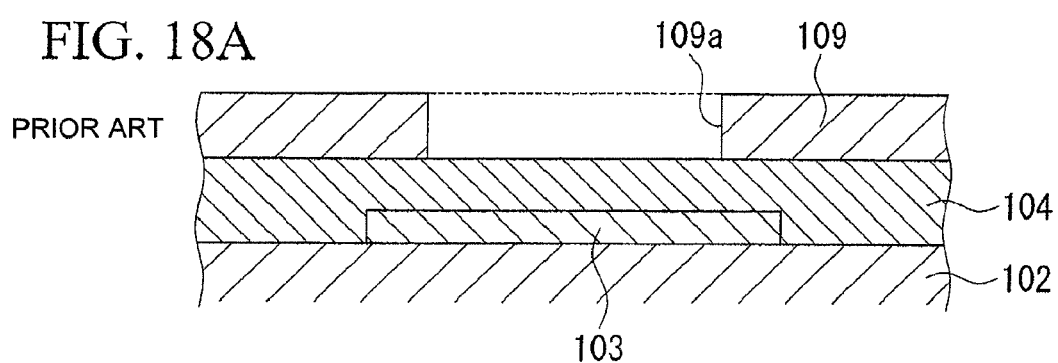
FIG. 18A is a cross-sectional view showing a first step for manufacturing the semiconductor device shown in FIG. 17.
Figure 18B:
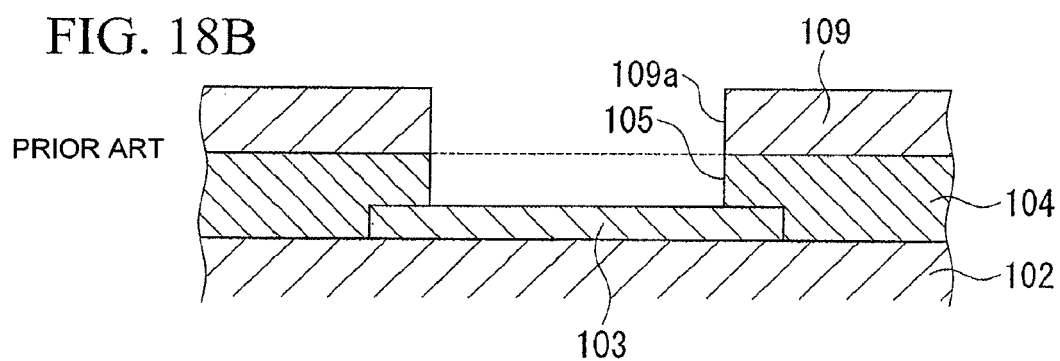
FIG. 18B is a cross-sectional view showing a second step for manufacturing the semiconductor device shown in FIG. 17.
Figure 18C:
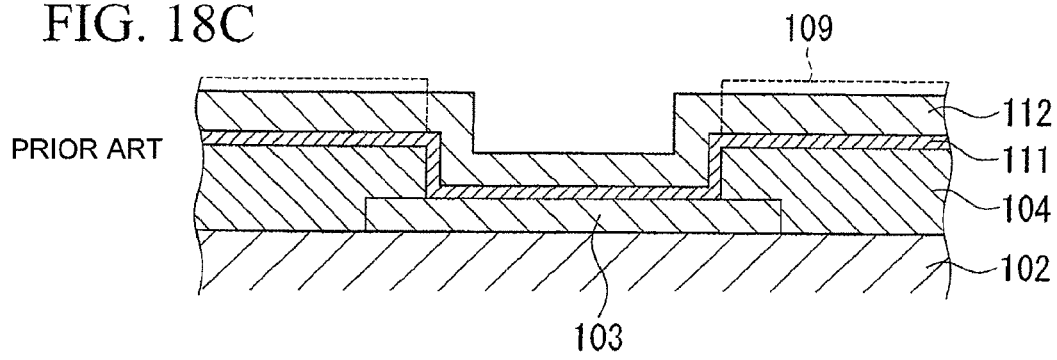
FIG. 18C is a cross-sectional view showing a third step for manufacturing the semiconductor device shown in FIG. 17.

FIG. 16A shows a first step in which an insulating layer 136 is formed to entirely cover an insulating layer 134 and a second wiring layer 135 with respect to both of the thin-film element section 160 and the external-terminal connection pad 170; then, a resist film 151 is formed on the insulating layer 136. Thereafter, patterning is performed using the resist film 151 as a mask, so that openings are formed at prescribed positions of the resist film 151 with respect to the thin-film element section 160 and the external-terminal connection pad 170, which are then subjected to exposure and heat treatment, whereby the side walls of the openings are each slanted against the bottom of the resist film 151 by a prescribed slanted angle θ, which ranges from 20° to 80°.

FIG. 16B shows a second step in which in accordance with the mask corresponding to the resist film 151, the insulating layer 136 is selectively removed using etching gas with respect to the thin-film element section 160 and the external-terminal connection pad 170, so that the second wiring layer 135 is partially opened. Then, the resist film 151 is removed. Thus, it is possible to form openings 136a whose side walls are each slanted against the bottom of the insulating layer 136 by the prescribed slanted angle θ ranging from 20° to 80°.

FIG. 16C shows a third step in which an insulating layer 137 is formed on the second wiring layer 135 and the insulating layer 136 so as to cover the openings 136a with respect to the thin-film element section 160 and the external-terminal connection pad 170.

FIG. 16D shows a fourth step in which a resist film 152 is formed on the insulating layer 137; then, patterning is performed using the resist film 152 as a mask so that an opening is formed at a prescribed position of the resist film 152 only with respect to the thin-film element section 160, which is then subjected to light exposure and heat treatment.

FIG. 16E shows a fifth step in which in accordance with the mask corresponding to the resist film 152, the insulating layer 137 is selectively removed using etching gas with respect to the thin-film element section 160, so that the second wiring layer 135 is partially opened. Then, the resist film 152 is removed. Thus, it is possible to form an opening 137a whose side walls are each slanted against the bottom of the insulating layer 137 by the prescribed slanted angle θ ranging from 20° to 80°. In this step, the insulating layer 137 regarding the external-terminal connection pad 170 is not selectively removed.

FIG. 16F shows a sixth step in which an insulating layer 138 is formed to cover the insulating layer 137 with respect to the external-terminal connection pad 170 and to cover the insulating layer 137, the opening 137a, and the second wiring layer 135 with respect to the thin-film element section 160. Then, a resist film 153 is formed on the insulating layer 138. Thereafter, patterning is performed using the resist film 153 as a mask so as to form openings at prescribed positions of the resist film 153 with respect to the thin-film element section 160 and the external-terminal connection pad 170, which are then subjected to light exposure and heat treatment.

FIG. 16G shows a seventh step in which in accordance with the mask corresponding to the resist film 153, the insulating layer 138 is selectively removed using etching gas with respect to the thin-film element section 160 and the external-terminal connection pad 170. Then, the resist film 153 is removed. In this step, the second wiring layer 135 is partially opened with respect to the thin-film element section 160, while the second wiring layer 135 covered with the insulating layer 137 is not opened with respect to the external-terminal connection pad 170.

Thereafter, the semiconductor device is transported to a thin-film element formation machine in order to form a thin-film element (not shown) and a thin-film element wiring layer 139 therefor in the openings 136a to 138a with respect to the thin-film element section 160. At this time, the second wiring layer 135 is covered with the insulating layer 137 with respect to the external-terminal connection pad 170, whereby it is possible to avoid the occurrence of erosion and oxidation due to oxygen and water in the air with respect to the second wiring layer 135. When the thin film element and thin-film element wiring layer 139 are formed in the openings 136a to 138a with respect to the thin-film element section 160 by means of the thin-film element formation machine, it is possible to prevent the second wiring layer 135 of the external-terminal connection pad 170 covered with the insulating layer 137 from being damaged due to plasma and the like.

FIG. 16H shows an eighth step in which after the formation of the thin-film element wiring layer 139, the semiconductor device is covered with a passivation film (or a protective layer) 140; then, a resist film 154 is formed to cover the passivation film 140 with respect to both of the thin-film element section 160 and the external-terminal connection pad 170. Then, patterning is performed using the resist film 154 as a mask, so that an opening is formed at a prescribed position of the resist film 154 with respect to the external-terminal connection pad 170, which is then subjected to light exposure and heat treatment.

FIG. 16I shows a ninth step in which in accordance with the mask corresponding to the resist film 154, the passivation film 140 and the insulating layer 137 are selectively removed using etching gas with respect to the external-terminal connection pad 170. In this step, the second wiring layer 135 is partially opened with respect to the external-terminal connection pad 170, while the second wiring layer 135 of the thin-film element section 160 covered with the resist film 154 is not damaged by the etching gas. Thereafter, the resist film 154 is removed. Thus, it is possible to completely produce the semiconductor device as shown in FIG. 16I.

In the semiconductor device of the present embodiment shown in FIG. 16I, the openings 136a to 138a for the thin-film element section 160 are formed in such a way that the opening 137a of the intermediate insulating layer 137 is opened inside of the opening 136a of the lowermost insulating layer 136, and the opening 138a of the uppermost insulating layer 138 is opened relative to the opening 137a of the intermediate insulating layer 137, whereas the openings 136a to 138a for the external-terminal connection pad 170 are formed in such a way that the opening 137a of the intermediate insulating layer 137 is opened relative to the opening 136a of the lowermost insulating layer 136, and the opening 138a of the uppermost insulating layer 138 is opened outside of the opening 137a of the intermediate insulating layer 137 and is opened relative to the opening 136a of the lowermost insulating layer 136. According to the manufacturing method of the semiconductor device of the present embodiment, it is possible to realize different shapes and different dimensions with respect to the openings 136a to 138a for the thin-film element section 160 and the openings 136a to 138a for the external-terminal connection pad 170 respectively.

In the manufacturing method of the present embodiment, the insulating layers for the external-terminal connection pad 170 are removed in two steps using two masks, wherein the resist film 153 is used for the removal of the insulating layer 138, and the resist film 154 is used for the removal of the passivation film 140 and the insulating layer 137. It is possible to modify the manufacturing method of the present embodiment in such a way that only a single resist film 154 is used to collectively remove all of the passivation film 140 and the insulating layers 137 and 138, whereby the openings 136a to 138a are formed with respect to the external-terminal connection pad 170.

The aforementioned modification can be realized by partially modifying the sixth step and eighth step. For example, in FIG. 16F, the resist film 153 on the insulating layer 138 is opened with respect to the thin-film element section 160 but is not opened with respect to the external-terminal connection pad 170, wherein etching is controlled so as not to selectively remove the insulating layer 138 for the external-terminal connection pad 170 by etching gas. In FIG. 16H, the resist film 154 for the external-terminal connection pad 170 is opened and is used as a mask for collectively removing the passivation film 140, and the insulating layers 137 and 138 by etching gas with respect to the external-terminal connection pad 170. That is, a plurality of insulating layers are collectively and simultaneously removed by using a single resist film as a mask, whereby it is possible to reduce troublesome operation in manufacturing.

Incidentally, it is possible to use a giant magnetoresistive element (GMR element) as a thin-film element formed in the thin-film element section 160. In this case, the external-terminal connection pad 170 can be used as a bias magnet layer corresponding to the lamination of magnet films, for example.

According to the present embodiment, a plurality of openings are formed in insulating layers so as to partially expose wiring layers such that side walls thereof are slanted in a step-like manner and are gradually expanded in the direction from the bottom to the upper end, whereby it is possible to prevent thin-film element wiring layers for establishing electric connections between wiring layers and thin-film elements from being broken, and it is possible to prevent external-terminal connection electrodes from being broken; hence, it is possible to avoid the occurrence of the initial characteristic failure such as the open failure. Thus, the present embodiment demonstrates outstanding effects when applied to composite chips, in which plural types of devices and functions are integrated on a single substrate, and large-scale composite chips in which plural types of devices and functions are highly integrated.

As this invention may be embodied in several forms without departing from the spirit or essential characteristics thereof, the aforementioned embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A manufacturing method for a semiconductor wafer on which a plurality of IC regions partitioned by scribing regions are formed to realize ICs having multilayer structures, and a plurality of seal rings are formed in peripheral areas of the ICs, said manufacturing method comprising the steps of:
    forming an uppermost wiring layer together with a continuous metal layer, which is formed in the seal ring;
    forming a planar insulating layer to cover the IC region, the metal layer, and the scribing region; and
    forming a passivation film to entirely cover the planar insulating layer,
    wherein the continuous metal layer formed in the seal ring includes a plurality of levels and extends into the planar insulating layer and towards each of the IC region and the scribing region.

2. The manufacturing method for a semiconductor wafer according to claim 1, wherein at least one thin-film element is formed on the planar insulating layer or the passivation film.

3. The manufacturing method for a semiconductor wafer according to claim 2, wherein a second protective insulating layer is formed to cover the thin-film element.

4. The manufacturing method for a semiconductor wafer according to claim 1, wherein a surface of the planar insulating layer is subjected to chemical mechanical polishing.

5. A manufacturing method for a semiconductor wafer on which a plurality of IC regions partitioned by scribing regions are formed to realize ICs having multilayer structures, and a plurality of seal rings are formed in peripheral areas of the ICs, said manufacturing method comprising the steps of:
    forming an uppermost wiring layer together with a continuous metal layer, which is formed in the seal ring;
    forming a planar insulating layer to cover the IC region, the continuous metal layer, and the scribing region;
    selectively removing a prescribed region of the planar insulating layer above the continuous metal layer; and
    forming a passivation film to cover the planar insulating layer and the metal layer,
    wherein the continuous metal layer formed in the seal ring includes a plurality of levels and extends into the planar insulating layer and towards each of the IC region and the scribing region.

6. The manufacturing method for a semiconductor wafer according to claim 5, wherein at least one thin-film element is formed on the planar insulating layer or the passivation film.

7. The manufacturing method for a semiconductor wafer according to claim 6, wherein a second protective insulating layer is formed to cover the thin-film element.

8. The manufacturing method for a semiconductor wafer according to claim 5, wherein a surface of the planar insulating layer is subjected to chemical mechanical polishing.

9. A manufacturing method for a semiconductor device in which a thin-film element is formed on a wiring layer of an IC region formed on a semiconductor substrate via a plurality of insulating layers, said manufacturing method comprising:

forming a first insulating layer;

forming a first resist film having a first resist opening whose wall is slanted and gradually expanded from a bottom to an upper end thereof;

selectively removing the first insulating layer by using the first resist film as a mask, thus forming a first opening in the first insulating layer that exposes a part of the wiring layer, wherein the first opening is slanted and gradually expanded from a bottom to an upper end thereof;

forming a second insulating layer that covers the first insulating layer and the first opening;

forming a second resist film having a second resist opening;

selectively removing the second insulating layer by using the second resist film as a mask, thus forming a second opening in the second insulating layer that exposes a portion of the part of the wiring layer, wherein the second opening is slanted and gradually expanded from a bottom to an upper end thereof, said second opening being smaller than the first opening; and forming a secondary wiring layer in the second opening of the second insulating layer so as to establish an electric connection between the wiring layer and the thin-film element.

10. The manufacturing method for a semiconductor device according to claim 9, wherein the wall of the first opening of the first resist film is slanted by a prescribed angle ranging from 20° to 80° about an axis lying in a thickness direction of the first resist film.

11. The manufacturing method for a semiconductor device according to claim 9, wherein mixed gas including freon gas and oxygen gas is used for selectively removing the insulating layers.

12. The manufacturing method for a semiconductor device according to claim 9, wherein the thin-film element is covered with a silicon nitride film.

13. A manufacturing method for a semiconductor device having a thin-film element, the method comprising:

forming a wiring layer of an IC region formed on a semiconductor substrate;

forming an insulating layer on the wiring layer;

forming a first opening and a second opening in the insulating layer to partially expose the wiring layer at different positions;

wherein the wiring layer is partially exposed in the first opening for establishing an electric connection between the wiring layer and the thin-film element so as to form a thin-film element section, and wherein the wiring layer is partially exposed in the second opening so as to form an external-terminal connection pad, which is separated from the thin-film element section, wherein the first opening is formed by removing the insulating layer covering the wiring layer with respect to the thin-film element section; then, the second opening is formed by removing the insulating layer covering the wiring layer with respect to the external-terminal connection pad.

14. The manufacturing method for a semiconductor device according to claim 13, wherein the insulating layer covering the wiring layer is removed using a resist film as a mask so as to form the second opening with respect to the external-terminal connection pad.

15. The manufacturing method for a semiconductor device according to claim 13, wherein the thin-film element is covered with a silicon nitride film.

\* \* \* \* \*